United States Patent
Hosseini et al.

(10) Patent No.: US 12,250,892 B2
(45) Date of Patent: *Mar. 11, 2025

(54) DISPLAY MATERIAL

(71) Applicant: E INK CORPORATION, Billerica, MA (US)

(72) Inventors: Peiman Hosseini, Bicester (GB); Clement Talagrand, Oxford (GB); Graham Triggs, Oxford (GB); Christopher Wright, Exmouth (GB); Noboru Yamada, Osaka (JP)

(73) Assignee: E Ink Corporation, Billerica, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/678,092

(22) Filed: May 30, 2024

(65) Prior Publication Data

US 2024/0334848 A1    Oct. 3, 2024

Related U.S. Application Data

(62) Division of application No. 17/416,848, filed as application No. PCT/GB2019/053628 on Dec. 19, 2019, now Pat. No. 12,041,862.

(30) Foreign Application Priority Data

Dec. 21, 2018    (GB) .................................. 1821051

(51) Int. Cl.
*H10N 70/00*    (2023.01)
*G02F 1/00*    (2006.01)
(Continued)

(52) U.S. Cl.
CPC ....... *H10N 70/8828* (2023.02); *G02F 1/0054* (2013.01); *G02F 1/009* (2013.01); *G02F 1/0147* (2013.01); *H10N 70/235* (2023.02)

(58) Field of Classification Search
CPC .............. H01N 70/235; H01N 70/8828; G02F 1/0054; G02F 1/009; G02F 1/0147
See application file for complete search history.

(56) References Cited

U.S. PATENT DOCUMENTS 9,987,873 B2    6/2018    Petiton et al.
10,317,707 B2    6/2019    Hosseini et al.
(Continued)

FOREIGN PATENT DOCUMENTS

| EP | 3608369 A1 | 2/2020 |
|---|---|---|
| WO | 2009033601 A1 | 3/2009 |
| WO | 2012076171 A1 | 6/2012 |

OTHER PUBLICATIONS

Cheng, Huai-Yu et al., "Crystallization properties of materials along the pseudo-binary line between GeTe and Sb", J. Appl. Phys., vol. 115, p. 093101 (2014).
(Continued)

*Primary Examiner* — Bijan Ahvazi
(74) *Attorney, Agent, or Firm* — Brian D. Bean

(57) ABSTRACT

Provided herein is a phase change material for use in a display device. Also provided is a display device comprising a phase change material; the use of a phase change material as an optical absorber in a display device; a method of fabricating a pixel; and a method of fabricating a display device. The phase change material is as described in more detail herein.

7 Claims, 8 Drawing Sheets

(51) Int. Cl.
  *G02F 1/01* (2006.01)
  *H10N 70/20* (2023.01)

(56) References Cited

U.S. PATENT DOCUMENTS

| | | | |
|---|---|---|---|
| 10,718,987 B2 | 7/2020 | Hosseini et al. | |
| 11,215,852 B2 | 1/2022 | Hosseini et al. | |
| 11,392,088 B2 | 7/2022 | Rottenberg et al. | |
| 2017/0031231 A1* | 2/2017 | Bhaskaran | G02F 1/0147 |

OTHER PUBLICATIONS

Hosseini, Peiman et al., "An optoelectronic framework enabled by low-dimensional phase-change films", Nature, vol. 511, No. 7508, pp. 206-211, (Jul. 9, 2014).

Kats, Mikhail A et al., "Nanometre optical coatings based on strong interference effects in highly absorbing media", Nat. Mater., vol. 12, pp. 20-24 (2013).

Wuttig, Mattias, "Phase-change materials Towards a Universal Memory?", Nat. Mater., vol. 4, pp. 265-266 (2005).

Ohno, Eiji et al., "TeGeSnAu Alloys for Phase Change Type Optical Disk Memories", Jpn. J. Appl. Phys., vol. 28, p. 1235 (1989).

Heikenfeld, J. et al., "A critical review of the present and future prospects for electronic paper", SID, 19(2), pp. 129-156 (2011).

Hong, John et al., "Single Mirror Interferometric Display—A New Paradigm for Reflective Display Technologies", SID, Book 2, Session 54, (Jul. 2014).

Telfer, Stephen J. et al., "A Full-Color Electrophoretic Display", SID Symposium Digest of Technical Papers, vol. 47, pp. 574-577 (May 2016).

El-Hinnawy, Nabil et al., "Improvements in GeTe-Based Inline Phase-Change Switch Technology for RF Switching Applications", CS Mantech Conference, No. 18, pp. 401-403 (May 2014).

Wang, Muzhi et al., "Performance measurements and non-linearity modeling of GeTe phase change RF switches with direct and indirect heating schemes", IEEE MTT-S International Microwave Symposium, (May 2015).

Lankhorst, Martijn H. R. et al., "Low-cost and nanoscale non-volatile memory concept for future silicon chips", Nat. Mater., vol. 5, pp. 347-352 (2005).

* cited by examiner

DISPLAY MATERIAL

CROSS REFERENCE TO RELATED APPLICATIONS

This application is a divisional of U.S. Ser. No. 17/416,848 filed on Jun. 21, 2021, which is a national stage entry of PCT International Application No. PCT/GB2019/053628, filed Dec. 19, 2019, which claims priority to Great Britain Application No. 1821051.8, filed Dec. 21, 2018, both of which are incorporated herein by reference as if set forth in their entirety for all purposes.

FIELD OF THE INVENTION

The present invention relates to a phase change material suitable for use in a display device. It also relates to a method of producing a phase change material; to a display device comprising a phase change material; and to the use of a phase change material as an optical absorber in a display device.

BACKGROUND TO THE INVENTION

Phase change materials have been known for many years for use in various memory applications. For example, phase change random access memory (PCRAM) records data by switching a phase change material between an amorphous and a crystalline state, wherein the two states have different optical and electronic properties. Similarly, phase change materials have been used in re-writeable optical storage devices since the 1990s where again data writing and re-writing is determined by switching between amorphous and crystalline states of the phase change material.

There are various properties that phase change materials need to have in order for them to be suitable for application in memory devices and optical storage devices. For example, suitable phase change materials need to have a high thermal stability at room temperature in order to be able to store information over prolonged periods. The phase change between amorphous and crystalline forms should be extremely rapid in order to allow fast data writing—in particular, the crystallisation time of the phase change material is often the rate limiting factor in such devices. A high melting point is also typically desired, and is often associated with elevated recrystallization temperatures. Typical materials for use in such applications have (re)crystallization temperatures in excess of about 140° C.; (re)crystallization times of about 1 ns to about 100 ns; and melting points in excess of about 600° C.

There has been extensive research to devise suitable phase change materials that fulfil these requirements. One well-characterised system is the GST system. GST phase change materials comprise germanium, antimony and tellurium. Many GST phase change materials have been developed to have desired characteristics, and in particular there has been extensive research conducted into GST materials having ever-faster crystallisation times. There has been little or no research effort into producing phase change materials that have properties that would render them unsuitable for use in memory devices or in optical storage devices. In particular, there has been little or no research effort into producing phase change materials that have intentionally low (re)crystallization temperatures; long (re)crystallization times or low melting points.

Ultra-thin film phase change material based devices have recently been shown to provide an entirely new means of generating bright, vividly coloured reflections from a surface, switchable between two strikingly different, bistable states. Uncoloured, highly absorbing dielectric films of 5-50 nm thickness have been shown to create coloured reflections when coated onto a metallic substrate due to the strong interference effect, with very little viewing angle dependence compared to traditional Fabry-Perot interference based devices. However, it has been generally believed that the high optical absorption of phase change materials, and limited scope for modulation of broadband visible light has precluded the use of these materials in display devices. Furthermore, it has been generally believed that the (re)crystallisation times of known phase change materials would be too rapid to allow pixel sized switching as required for display devices. It has also been generally believed that the high melting point of known phase change materials would preclude low energy switching between states, as is desirable in display devices. These technical problems have been previously considered to preclude the use of phase change materials in display devices.

BRIEF DESCRIPTION OF THE INVENTION

The present inventors have now recognised that the technical problems set out above can be overcome, and that phase change materials may, surprisingly, be used in display devices. The present inventors also have developed specific phase change materials which have properties which render them particularly suited to use in such applications. Among the properties that have been found to be particularly important for determining the suitability of a phase change material for use in a display device are the recrystallisation temperature, the recrystallization time and the melting point. In this regard, the present inventors have surprisingly found that particularly advantageous results arise from phase change materials which have a recrystallization temperature of at most about 250° C.; a recrystallization time of at least about 1 μs; and/or a melting point of at most about 500° C. The importance of these properties has not been previously recognised. The inventors have also found that phase change materials having high cyclability are advantageous when used in a display device in accordance with the present disclosure, Accordingly, the present invention provides a phase change material for use in a display device, wherein said phase change material has a recrystallization temperature of at most about 250° C. and a recrystallization time of at least about 1 μs. The phase change material preferably has a melting point of at most about 500° C. Preferably, the phase change material has a cyclability corresponding to at least 99% contrast remaining (relative to the initial contrast) after 1000 crystallisation/amorphisation cycles. Preferably, the phase change material comprises (a) germanium, antimony and tellurium; (b) selenium, tellurium and tin; (c) germanium, tin and tellurium; (d) bismuth, tin and tellurium; (e) bismuth, tin and selenium; (f) bismuth, tin and sulphur; or (g) combinations of the above The invention also provides a method of producing a phase change material which is suitable for use in a display device, the method comprising sintering, co-sputtering or co-evaporating the elemental components of the phase change material.

The invention also provides a display device comprising a phase change material, wherein said phase change material has a recrystallization temperature of at most about 250° C. and a recrystallization time of at least about 1 μs, wherein optionally said phase change material has a melting point of at most about 500° C. The invention further provides a display device comprising a phase change material, wherein said phase change material has a melting point of at most about 500° C., wherein optionally said phase change material has a recrystallization temperature of at most about 250° C. and a recrystallization time of at least about 1 Vs. Preferably, the device of the invention comprises a layer of the phase change material. Preferably, the display device of the invention is a solid-state reflective display device. Preferably, the phase change material comprised in the device is a phase change material as described herein.

The invention also provides a display device comprising:
a plurality of electrodes:
at least one layer of a phase change material having (i) a recrystallization temperature of at most about 250° C. and a recrystallization time of at least about 1 µs; and/or (ii) a melting point of at most about 500° C.; said phase change material having a refractive index which is reversibly controllable by application of a voltage to said electrodes;
a controller adapted to apply said voltage, via said electrodes, to control the refractive index of said phase change material;
wherein said at least one layer of said phase change material is disposed between a reflector and a viewing surface;
and wherein said display device optionally further comprises:
at least one spacer layer between said reflector and at least one layer of said phase change material; and/or
a capping layer, wherein a surface of said capping layer preferably constitutes said viewing surface.

Optionally, the display device further comprises at least one barrier layer between at least one layer of said phase change material and at least one said spacer layer and/or at least one said capping layer. Preferably, the phase change material comprised in the device is a phase change material as described herein.

The invention also provides a method of fabricating a display device, comprising sputtering at least one layer of a phase change material onto a surface, wherein said sputtering is preferably DC sputtering. Preferably the phase change material is a phase change material as described herein.

The invention also provides a display comprising a plurality of independently controllable display devices as described herein.

The invention further provides the use of a phase change material as an optical absorber in a display device, wherein said phase change material has (i) a recrystallization temperature of at most about 250° C. and a recrystallization time of at least about 1 µs; and/or (ii) a melting point of at most about 500° C. Preferably, the phase change material is a phase change material as described herein.

DETAILED DESCRIPTION OF THE INVENTION

Figure 1:
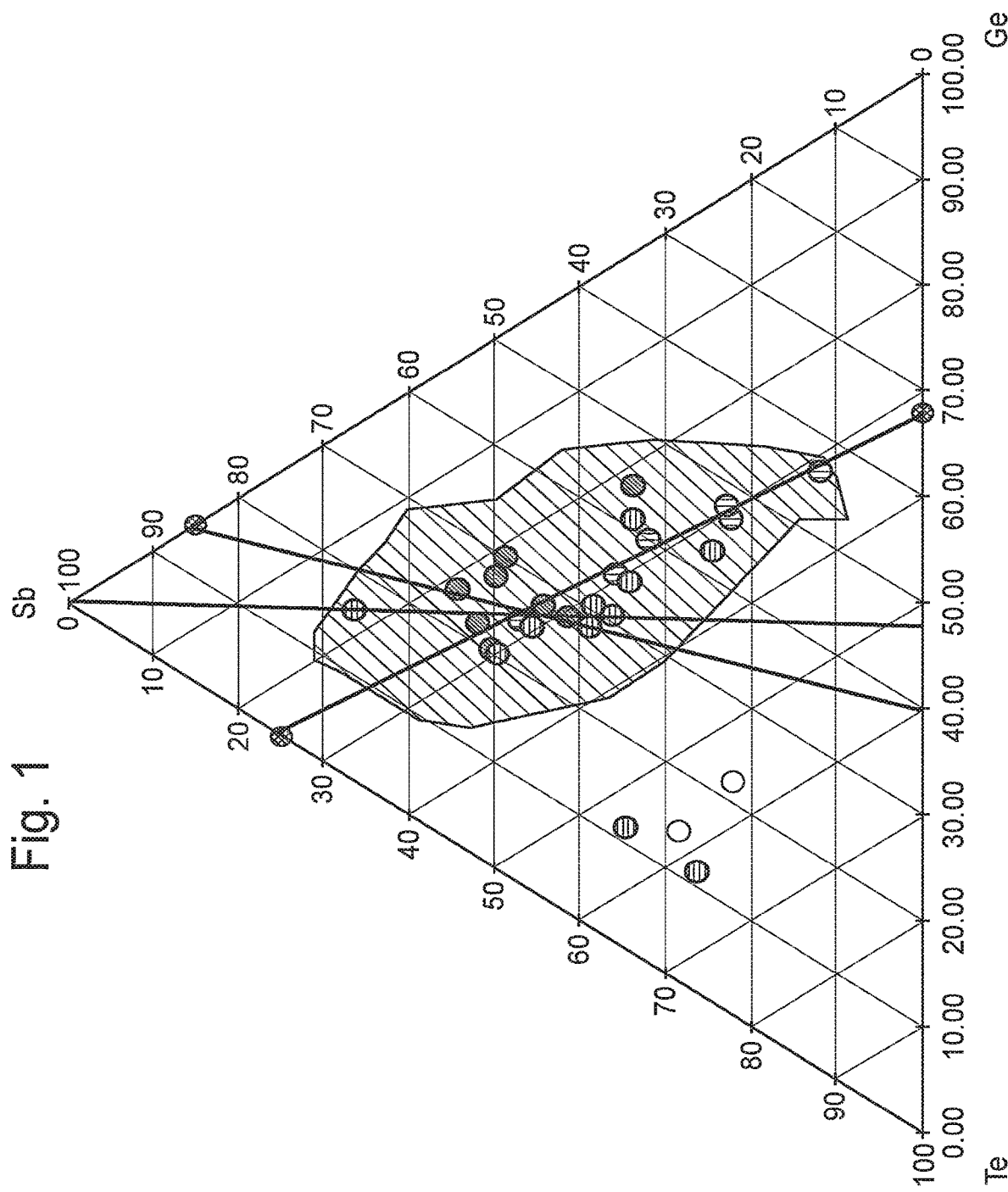
FIG. 1 shows a ternary diagram for a phase change material comprising germanium, antimony and tellurium. The compositions of specific phase change materials in accordance with the invention are shown. The shaded region corresponds to the region of the ternary diagram defining preferred phase change materials in accordance with the invention.

The invention provides a phase change material for use in a display device, wherein said phase change material has a recrystallization temperature of at most about 250° C. and a recrystallization time of at least about 1 µs. The phase change material is suitable for use in a display device.

The phase change material of the invention is suitable for use in any suitable display device. Suitable display devices are described in more detail herein.

Phase Change Materials

The invention involves the use of phase change materials. As used herein, a phase change material is a material which changes state under certain conditions. The phase change materials used in the invention typically switch between an amorphous state and a crystalline state when subjected to appropriate temperature or electrical triggers.

Preferably, in the invention, the phase change material has a recrystallization temperature of at most about 200° C. More preferably, the phase change material has a recrystallization temperature of at most about 150° C., e.g. at most about 140° C. such as at most about 130° C., e.g at most about 120° C. Preferably, the phase change material has a recrystallization temperature of at least about 70° C. More preferably, the phase change material has a recrystallization temperature of at least about 80° C., such as at least about 90° C., e.g. at least 100° C. Preferably, therefore, the phase change material of the invention has a recrystallization temperature of from about 70° C. to about 250° C.; more preferably the phase change material has a recrystallization temperature of from about 80° C. or 90° C. to about 200° C.; e.g. from about 100° C. to about 150° C.

Preferably, the phase change material has a recrystallization time of at least about 2 µs; more preferably the phase change material has a recrystallization time of at least about 3 µs. More preferably, the phase change material has a recrystallization time of at least about 4 µs, such as at least about 5 µs, e.g. at least about 10 µs. Preferably, the phase change material has a recrystallization time of at most about 1000 µs, more preferably at most about 500 µs. More preferably, the phase change material has a recrystallization time of at most about 100 µs, such as at most about 80 µs e.g. at most about 60 µs. Preferably, therefore, the phase change material has a recrystallization time of from about 1 µs to about 1000 µs, more preferably from about 2 µs to about 500 µs; still more preferably from about 2 µs to about 100 µs, such as from about 3 µs to about 50 µs; e.g. from about 4 µs to about 20 µs for example from about 5 µs to about 10 µs. Ranges of from about 2 µs to about 10 µs may be suitable in some applications. As the area of the phase change material that is to be switched increases it is typically desirable to use phase change materials having slower crystallisation times.

Preferably, therefore the phase change material of the invention has a recrystallization temperature of at most about 200° C. and/or a recrystallization time of at least about 2 µs; more preferably the phase change material has a recrystallization temperature of at least about 70° C. and/or a recrystallization time of at most about 100 µs.

Recrystallisation times and recrystallization temperatures can be determined using any suitable technique. One preferred technique, described in "*Crystallization properties of materials along the pseudo-binary line between GeTe and Sb*", Journal Of Applied Physics 115, 093101 (2014), involves applying to a grid of samples of the phase change material a series of laser pulses of varying power and duration. Reflectance of the laser is measured as a function of the applied power and pulse duration. Crystallisation is identified with increasing reflected laser signal. The (re) crystallisation speed is associated with the minimum laser pulse duration (typically measured in µs) that results in a desired reflectance change, typically of ≥[20] %. The (re) crystallisation temperature is measured by ramping up the temperature of an as deposited, amorphous, film while monitoring its reflectance in the visible spectrum. A sudden change in reflectance (from high to low or vice versa depending on the specific design of the stack) marks the onset of crystallisation. The corresponding temperature is known as the crystallisation temperature.

Preferably, the phase change material has a melting point of at most about 500° C. Preferably, the phase change material has a melting point of at most about 450; e.g. at most about 400° C. such as at most about 380° C. Preferably the phase change material has a melting point of at least about 200° C., e.g. at least about 250° C. such as at least about 300° C. Preferably, therefore the phase change material has a melting point of from about 200° C. to about 500° C., e.g. from about 250° C. to about 450° C. such as from about 300° C. to about 400° C.

The melting point of a phase change material can be measured by any suitable means. Melting point apparatus are well known in the art and typically operate by optical recording of the state of the sample as a temperature ramp is applied. For example, the melting point may be measured by differential scanning calorimetry (DSC) or thermogravimetric analysis (TGA/DTA). Preferably, the ratio of the melting point of the phase change material to the recrystallization temperature of the phase change material is from about 2 to about 6, e.g. from about 3 to about 5, such as about 4. In other words, the mlting point of the phase change material is preferably about 2 to about 6 times, e.g. about 3 to about 5 times (such as about 4 times) greater than the recrystallization temperature of the phase change material.

Preferably, the phase change material comprises (or consists of) (a) germanium, antimony and tellurium; (b) selenium, tellurium and tin; (c) germanium, tin and tellurium; (d) bismuth, tin and tellurium; (e) bismuth, tin and selenium; (f) bismuth, tin and sulphur; or (g) combinations thereof. More preferably, the phase change material comprises (or consists of) (a) germanium, antimony and tellurium; (b) selenium, tellurium and tin; or (c) germanium, tin and tellurium.

Phase change materials which comprise germanium, antimony and tellurium are known as GST materials. GST phase change materials have been investigated previously for use in re-writable optical storage devices and in memory devices. Many GST materials have been described in the literature as having high recrystallization temperatures, fast recrystallization speeds and high melting points. For example, exemplary known GST phase change materials have recrystallization temperatures in excess of 140° C.; recrystallization times between about 1 ns and about 100 ns; and melting points of between about 600° C. and about 700° C. Such known GST phase change materials are typically not suitable for use in a display device in accordance with the present invention.

Preferably, when the phase change material comprises germanium, antimony and tellurium, the composition of the phase change material is as shown in the region of the ternary diagram highlighted in FIG. 1.

Preferably, when the phase change material comprises germanium, antimony and tellurium; the phase change material comprises (or consists of) between about 10 at % and about 60 at % germanium; between about 10 at % and about 70 at % antimony; and between about 10 at % and about 40 at % tellurium; wherein the sum of the amounts of germanium, antimony and tellurium is less than or equal to 100 at %. Preferably, when such phase change materials comprise more than about 35 at % germanium, they also comprise more than about 15 at % tellurium; when they comprise more than about 50 at % germanium, they also comprise more than about 20 at % tellurium; and/or when they comprise more than about 55 at % germanium, they also comprise more than about 25 at % tellurium. (As used herein, the term at % refers to the atomic percentage.)

More preferably, when the phase change material comprises germanium, antimony and tellurium, the phase change material comprises (or consists of) between about 15 at % and about 60 at % germanium; between about 10 at % and about 70 at % antimony; and between about 15 at % and about 35 at % tellurium; wherein the sum of the amounts of germanium, antimony and tellurium is less than or equal to 100 at %. Preferably, when such phase change materials comprise more than about 47 at % germanium, they also comprise more than about 25 at % tellurium Still more preferably, when the phase change material comprises germanium, antimony and tellurium, the phase change material comprises (or consists of) between about 20 at % and about 57 at % germanium; between about 10 at % and about 55 at % antimony; and between about 20 at % and about 33 at % tellurium; wherein the sum of the amounts of germanium, antimony and tellurium is less than or equal to 100 at %. Preferably, when such phase change materials comprise more than about 50 at % germanium, they also comprise more than about 27 at % tellurium.

Yet more preferably, when the phase change material comprises germanium, antimony and tellurium, the phase change material comprises (or consists of) between about 20 at % and about 50 at % germanium; between about 20 at % and about 55 at % antimony; and between about 20 at % and about 33 at % tellurium; wherein the sum of the amounts of germanium, antimony and tellurium is less than or equal to 100 at %.

Accordingly, when the phase change material comprises germanium, antimony and tellurium, the phase change material preferably comprises from about 10 at % Ge to about 60 at % Ge, such as from about 15 at % Ge to about 57 at % Ge, e.g. from about 20 at % Ge to about 50 at % Ge. Such phase change materials preferably comprise from about 10 at % Sb to about 70 at % Sb, such as from about 20 at % Sb to about 55 at % Sb. Such phase change materials preferably comprise from about 10 at % Te to about 40 at % Te, such as from about 15 at % Te to about 35 at % Te, e.g. from about 20 at % Te to about 33 at % Te. Those skilled in the art will appreciate that the total amount of Ge, Sb and Te cannot exceed 100 at %.

The invention also provides phase change materials which consist of any of the compositions described herein.

Phase change materials which comprise selenium, tellurium and tin are known as STS materials. STS phase change materials have been investigated previously for use in re-writable optical storage devices and in memory devices. STS materials are also typically described in the literature as having high recrystallization temperatures, fast recrystallization speeds and high melting points, and, like GST phase change materials, the use of STS phase change materials in display devices has not been previously described. STS materials having high recrystallization temperatures, fast recrystallization speeds and high melting points would not be suitable for use in display devices in accordance with the present invention.

Figure 2:
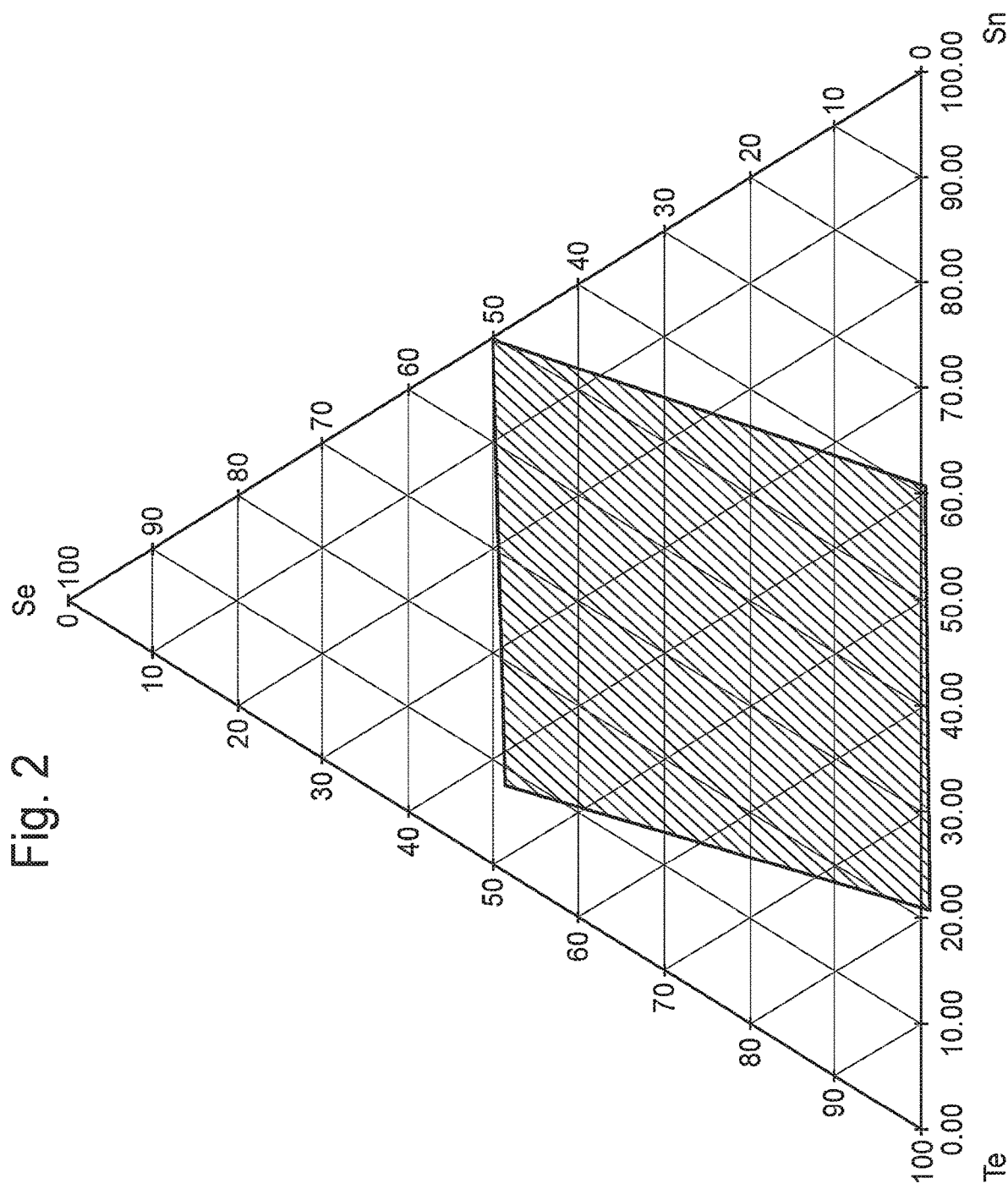
FIG. 2 shows a ternary diagram for a phase change material comprising selenium, tellurium and tin. The shaded region corresponds to the region of the ternary diagram defining preferred phase change materials in accordance with the invention.

Preferably, when the phase change material comprises selenium, tellurium and tin, the composition of the phase change material is as shown in the region of the ternary diagram highlighted in FIG. 2.

Preferably, when the phase change material comprises selenium, tellurium and tin, the phase change material comprises (or consists of) between about 1 at % and about 60 at % selenium; between about 1 at % and about 80 at % tellurium; and between about 10 at % and about 60 at % tin; wherein the sum of the amounts of selenium, tellurium and tin is less than or equal to 100 at %. More preferably, when the phase change material comprises selenium, tellurium and tin, the phase change material comprises (or consists of) between about 10 at % and about 55 at % selenium; between about 10 at % and about 70 at % tellurium; and between about 20 at % and about 50 at % tin; wherein the sum of the amounts of selenium, tellurium and tin is less than or equal to 100 at %. Yet more preferably, when the phase change material comprises selenium, tellurium and tin, the phase change material comprises (or consists of) between about 45 at % and about 55 at % selenium; between about 15 at % and about 30 at % tellurium; and between about 25 at % and about 40 at % tin, wherein the sum of the amounts of selenium, tellurium and tin is less than or equal to 100 at %. An exemplary STS phase change material for use in accordance with the invention comprises (or consists of) about 51 at % Se, about 21 at % Te and about 28 at % Sn.

Accordingly, when the phase change material comprises selenium, tellurium and tin, the phase change material preferably comprises from about 1 at % Se to about 60 at % Se, such as from about 10 at % Se to about 55 at % Se, e.g. from about 45 at % Se to about 55 at % Se. Such phase change materials preferably comprise from about 1 at % Te to about 80 at % Te, such as from about 10 at % Te to about 70 at % Te, e.g. from about 15 at % Te to about 30 at % Te. Such phase change materials preferably comprise from about 10 at % Sn to about 60 at % Sn, such as from about 20 at % Sn to about 50 at % Sn, e.g. from about 25 at % Sn to about 40 at % Sn. Those skilled in the art will appreciate that the total amount of Se, Te and Sn cannot exceed 100 at %.

Phase change materials which comprise germanium, tin and tellurium are known as GeSnTe materials. GeSnTe phase change materials have been investigated previously for use in applications apart from display applications. GeSnTe phase change materials are typically described as having high recrystallization temperatures, fast recrystallization speeds and high melting points; such materials would not be suitable for use in display devices in accordance with the present invention. GeSnTe phase change materials can be described as Te-rich when the phase change materials comprise significantly more Te than Ge or Sn. Preferably, in the invention, when the phase change material is a GeSnTe phase change material the phase change material is a Te-rich GeSnTe phase change material.

Figure 3:
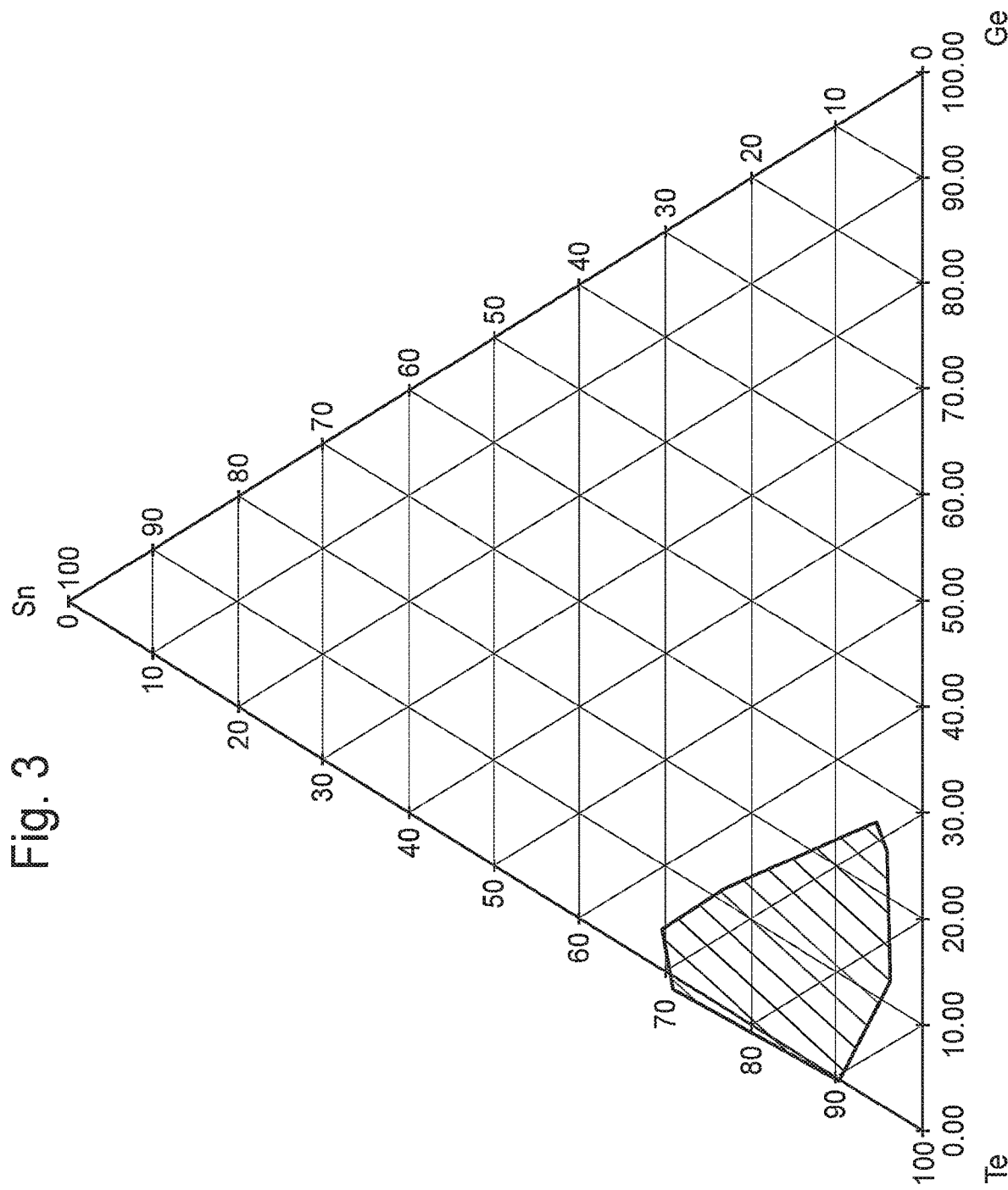
FIG. 3 shows a ternary diagram for a phase change material comprising germanium, tin and tellurium. The shaded region corresponds to the region of the ternary diagram defining preferred phase change materials in accordance with the invention.

Preferably, when the phase change material comprises germanium, tin and tellurium, the composition of the phase change material is as shown in the region of the ternary diagram highlighted in FIG. 3.

Preferably, when the phase change material comprises germanium, tin and tellurium, the phase change material comprises (or consists of) between about 1 at % and about 30 at % germanium; between about 1 at % and about 30 at % tin and between about 65 at % and about 95 at % tellurium; wherein the sum of the amounts of germanium, tin and tellurium is less than or equal to 100 at %. More preferably, when the phase change material comprises germanium, tin and tellurium, the phase change material comprises (or consists of) between about 5 at % and about 25 at % germanium; between about 3 at % and about 25 at % tin; and between about 70 at % and about 90 at % tellurium; wherein the sum of the amounts of germanium, tin and tellurium is less than or equal to 100 at %. Yet more preferably, when the phase change material comprises germanium, tin and tellurium, the phase change material comprises (or consists of) between about 5 at % and about 10 at % germanium; between about 3 at % and about 15 at % tin; and between about 80 at % and about 90 at % tellurium; wherein the sum of the amounts of germanium, tin and tellurium is less than or equal to 100 at %. An exemplary Te-rich GeSnTe phase change material for use in accordance with the invention comprises (or consists of) about 8 at % Ge, about 5 at % Sn and about 87 at % Te. A further exemplary Te-rich GeSnTe phase change material for use in accordance with the invention comprises (or consists of) about 5 at % Ge, about 15 at % Sn and about 80 at % Te.

Accordingly, when the phase change material comprises germanium, tin and tellurium, the phase change material preferably comprises from about 1 at % Ge to about 30 at % Ge, such as from about 5 at % Ge to about 25 at % Ge, e.g. from about 5 at % Ge to about 10 at % Ge. Such phase change materials preferably comprise from about 1 at % Sn to about 30 at % Sn, such as from about 3 at % Sn to about 25 at % Sn, e.g. from about 3 at % Sn to about 15 at % Sn. Such phase change materials preferably comprise from about 65 at % Te to about 95 at % Te, such as from about 70 at % Te to about 90 at % Te, e.g. from about 80 at % Te to about 90 at % Te. Those skilled in the art will appreciate that the total amount of Ge, Sn and Te cannot exceed 100 at %.

Phase change materials which comprise bismuth, tin and tellurium are known as BiSnTe materials. BiSnTe phase change materials which have been described as having high recrystallization temperatures, fast recrystallization speeds and high melting points would not be suitable for use in display devices in accordance with the present invention.

Figure 4:
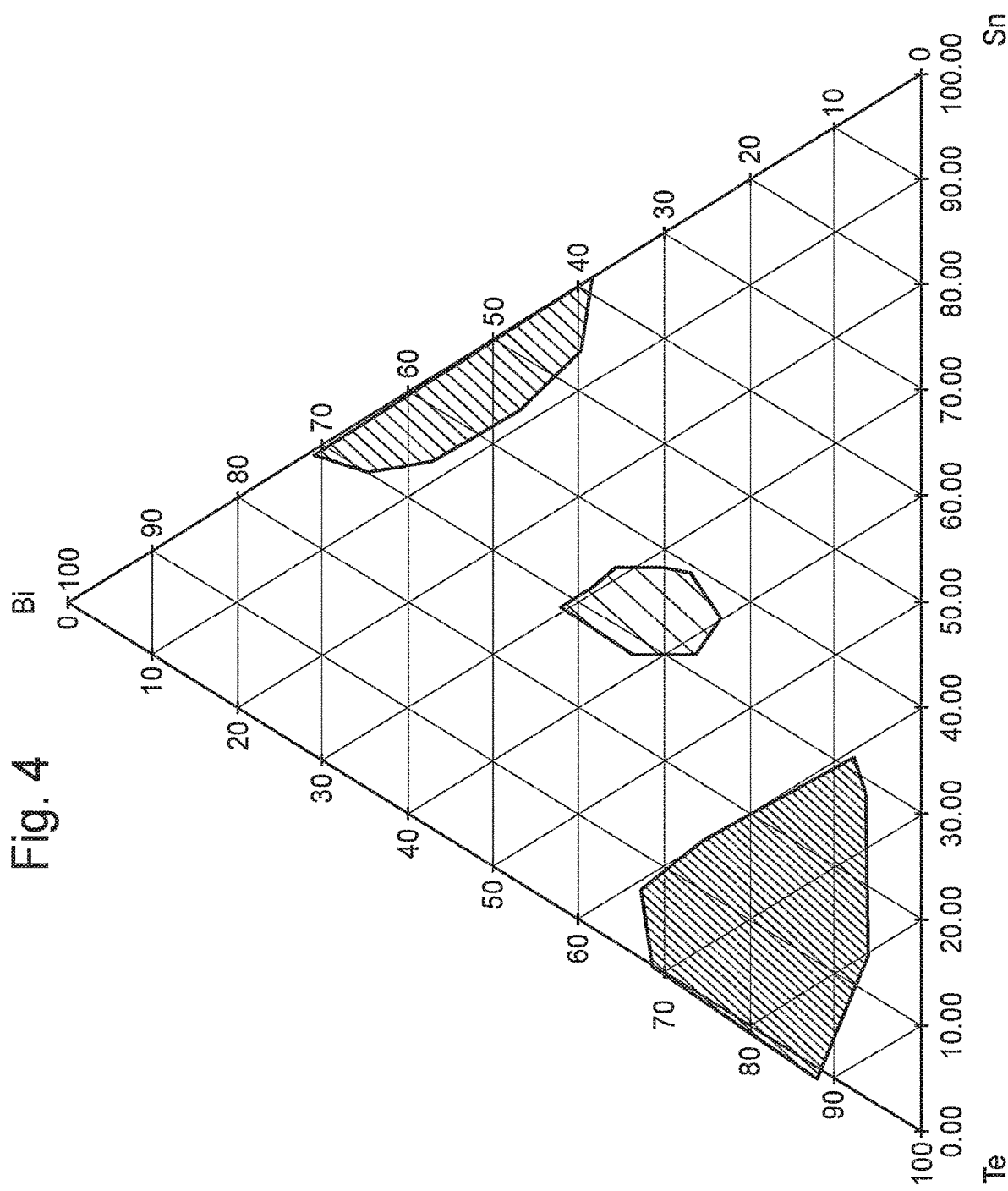
FIG. 4 shows a ternary diagram for a phase change material comprising bismuth, tin and tellurium. The shaded region corresponds to the region of the ternary diagram defining preferred phase change materials in accordance with the invention.

Preferably, when the phase change material comprises bismuth, tin and tellurium, the composition of the phase change material is as shown in the regions of the ternary diagram highlighted in FIG. 4.

Preferably, when the phase change material comprises bismuth, tin and tellurium, the phase change material comprises (or consists of):
(i) between about 5 at % and about 35 at % bismuth; between about 1 at % and about 35 at % tin and between about 60 at % and about 90 at % tellurium;
(ii) between about 20 at % and about 45 at % bismuth; between about 25 at % and about 40 at % tin and between about 25 at % and about 45 at % tellurium; or
(iii) between about 35 at % and about 75 at % bismuth; between about 25 at % and about 65 at % tin and between about 1 at % and about 10 at % tellurium; wherein the sum of the amounts of bismuth, tin and tellurium is less than or equal to 100 at %.

More preferably, when the phase change material comprises germanium, tin and tellurium, the phase change material comprises (or consists of):
(i) between about 7 at % and about 33 at % bismuth; between about 1 at % and about 32 at % tin and between about 60 at % and about 90 at % tellurium;
(ii) between about 24 at % and about 43 at % bismuth; between about 28 at % and about 39 at % tin and between about 29 at % and about 42 at % tellurium; or
(iii) between about 38 at % and about 72 at % bismuth; between about 28 at % and about 62 at % tin and between about 1 at % and about 8 at % tellurium; wherein the sum of the amounts of bismuth, tin and tellurium is less than or equal to 100 at %.

Accordingly, when the phase change material comprises bismuth, tin and tellurium, the phase change material preferably comprises:
(i) from about 5 at % Bi to about 35 at % Bi, such as from about 7 at % Bi to about 33 at % Bi. Such phase change materials preferably comprise from about 1 at % Sn to about 35 at % Sn, such as from about 3 at % Sn to about 32 at % Sn. Such phase change materials preferably comprise from about 60 at % Te to about 90 at % Te, such as from about 65 at % Te to about 85 at % Te;
(ii) from about 20 at % Bi to about 45 at % Bi, such as from about 24 at % Bi to about 43 at % Bi. Such phase change materials preferably comprise from about 25 at % Sn to about 40 at % Sn, such as from about 28 at % Sn to about 39 at % Sn. Such phase change materials preferably comprise from about 25 at % Te to about 45 at % Te, such as from about 29 at % Te to about 42 at % Te; or
(iii) from about 35 at % Bi to about 75 at % Bi, such as from about 38 at % Bi to about 72 at % Bi. Such phase change materials preferably comprise from about 25 at % Sn to about 65 at % Sn, such as from about 28 at % Sn to about 62 at % Sn. Such phase change materials preferably comprise from about 1 at % Te to about 10 at % Te, such as from about 2 at % Te to about 8 at % Te Those skilled in the art will appreciate that the total amount of Ge, Sn and Te cannot exceed 100 at %.

A phase change material for use in accordance with the invention may sometimes comprise one or more dopants. Typically the total amount of dopants does not exceed 15%, e.g. at most 10%, such as at most 5% e.g. at most 1%, e.g. at most 0.1%. The phase change material may comprise in total from about 0.1 at % to about 10 at % or about 15% of one or more dopants, e.g. from about 0.5 at % or 1 at % to about 8 at % dopant(s), such as from about 2 at % to about 5 at %. Any suitable dopants known in the art can be included in the phase change materials of the present invention. When a phase change material for use in accordance with the invention comprises one or more dopants, said one or more dopants are preferably independently selected from carbon, oxygen, nitrogen, bismuth, gold, germanium, tin, tellurium, selenium, sulphur, and (when the phase change material comprises or consists of germanium, tin and tellurium) gold. Preferred dopants are selected from carbon, oxygen, nitrogen, bismuth, and (when the phase change material comprises or consists of germanium, tin and tellurium) gold. Carbon can be beneficially used as a dopant to lower the melting temperature of the phase change material. Oxygen and/or nitrogen can be beneficially used to improve the stability and/or cyclability (discussed below) of the phase change material, and/or to increase the crystallisation temperature of the phase change material. Bismuth can be beneficially used to increase recrystallization speed (i.e. to decrease recrystallization times) and/or to lower the melting time. When the phase change material comprises or consists of germanium, tin and tellurium, gold can be used to increase recrystallization speed (i.e. to decrease recrystallization times).

Accordingly, a phase change material according to the invention may comprise (or consist of) (a) germanium, antimony and tellurium; (b) selenium, tellurium and tin; (c) germanium, tin and tellurium; (d) bismuth, tin and tellurium; (e) bismuth, tin and selenium; (f) bismuth, tin and sulphur; or (g) combinations thereof; and at most about 15% of one or more dopants. More preferably, a phase change material according to the invention may comprise (or consist of) (a) germanium, antimony and tellurium; (b) selenium, tellurium and tin; or (c) germanium, tin and tellurium; and at most about 15% of one or more dopants, wherein said dopants are preferably selected from carbon, oxygen, nitrogen, bismuth, gold, germanium, tin, tellurium, selenium, sulphur, and (when the phase change material comprises or consists of germanium, tin and tellurium) gold.

Phase change materials according to the invention typically exhibit high cyclability. Cyclability can be determined using any suitable measure. Briefly, in one exemplary technique, crystallisation power and pulse width is determined as described above for determining the crystallisation time and temperature. A "reference" amorphisation pulse power is defined by inducing amorphisation by applying a high power/high temperature pulse that exceeds the melting point of the phase change material. The pulse width is typically short, e.g. 0.5 µs. Multiple crystallisation/amorphisation cycles are performed. The "reference" amorphisation pulse power is defined such that the switching contrast of a reference cycle (e.g. the $20^{th}$ cycle) is a predefined fraction of the contrast of the first cycle (e.g. 75% of the first cycle). Recrystallisation/reamorphisation cycles are then performed using pulses corresponding to the crystallisation width and power and the reference amorphisation pulse power and a pre-defined width (e.g. 0.5 µs or 10 µs). Cyclability can be determined as either the percentage of the initial contrast remaining after e.g. 1000 cycles, or the number of cycles achieved before the contrast drops to e.g. 50% of the initial contrast. Preferably, in the invention, a phase change material has a cyclability corresponding to at least 90% contrast remaining after 1000 cycles; more preferably at least 99% remaining e.g. at least 99.9% remaining such as at least 99.99% remaining after 1000 cycles. The number of cycles achieved before the contrast drops to 50% of the initial contrast can be referred to as the $Cyc_{50}$. Accordingly, in the invention, a phase change material preferably has a $Cyc_{50}$ value of at least $10^4$, such as at least $10^5$, e.g. at least $10^6$, such as at least $10^7$ or more. Cyclability is preferably determined using a reamorphisation pulse width of 10 µs.

Preferably, in the invention, therefore:

the phase change material has a recrystallization temperature of from about 70° C. to about 250° C.; a recrystallization time of from about 1 µs to about 1000 µs; and a melting point of from about 200° C. to about 500° C.; and the phase change material comprises:
between about 10 at % and about 60 at % germanium; between about 10 at % and about 70 at % antimony; and between about 10 at % and about 40 at % tellurium; wherein the sum of the amounts of germanium, antimony and tellurium is less than or equal to 100 at %; or
between about 1 at % and about 60 at % selenium; between about 1 at % and about 80 at % tellurium; and between about 10 at % and about 60 at % tin; wherein the sum of the amounts of selenium, tellurium and tin is less than or equal to 100 at %; or
between about 1 at % and about 30 at % germanium; between about 1 at % and about 30 at % tin and between about 65 at % and about 95 at % tellurium; wherein the sum of the amounts of germanium, tin and tellurium is less than or equal to 100 at %; or
between about 5 at % and about 75 at % bismuth; between about 1 at % and about 65 at % tin and between about 1 at % and about 90 at % tellurium; wherein the sum of the amounts of germanium, tin and tellurium is less than or equal to 100 at %; and the phase change material optionally comprises one or more dopants.

Preferably the phase change material has a cyclability corresponding to at least 99% contrast remaining (relative to the initial contrast) after 1000 crystallisation/amorphisation cycles.

More preferably, in the invention:

the phase change material has a recrystallization temperature of from about 100° C. to about 200° C.; a recrystallization time of from about 2 µs to about 500 µs; and a melting point of from about 250° C. to about 450° C.; and the phase change material comprises:
between about 15 at % and about 60 at % germanium; between about 10 at % and about 70 at % antimony; and between about 15 at % and about 35 at % tellurium; wherein the sum of the amounts of germanium, antimony and tellurium is less than or equal to 100 at %; or
between about 10 at % and about 55 at % selenium; between about 10 at % and about 70 at % tellurium; and between about 20 at % and about 50 at % tin; wherein the sum of the amounts of selenium, tellurium and tin is less than or equal to 100 at %; or
between about 5 at % and about 25 at % germanium; between about 3 at % and about 25 at % tin; and between about 70 at % and about 90 at % tellurium;
wherein the sum of the amounts of germanium, tin and tellurium is less than or equal to 100 at %; or
between about 5 at % Bi and about 35 at % Bi; between about 1 at % Sn and about 35 at % Sn; and between about 60 at % Te and about 90 at % Te; or between about 20 at % Bi and about 45 at % Bi; between about 25 at % Sn and about 40 at % Sn; and between about 25 at % Te and about 45 at % Te; or between about 35 at % Bi and about 75 at % Bi; between about 25 at % Sn and about 65 at % Sn; and between about 1 at % Te and about 10 at % Te; wherein the sum of the amounts of bismuth, tin and tellurium is less than or equal to 100 at %; and the phase change material optionally comprises in total at most about 15 at % of one or more dopants.

Preferably the phase change material has a cyclability corresponding to at least 99.9% contrast remaining (relative to the initial contrast) after 1000 crystallisation/amorphisation cycles.

Still more preferably, in the invention:

the phase change material has a recrystallization temperature of from about 100° C. to about 150° C.; a recrystallization time of from about 2 µs to about 100 µs; and a melting point of from about 300° C. to about 400° C.; and the phase change material comprises:
between about 20 at % and about 57 at % germanium; between about 10 at % and about 55 at % antimony; and between about 20 at % and about 33 at % tellurium; wherein the sum of the amounts of germanium, antimony and tellurium is less than or equal to 100 at %; or
between about 45 at % and about 55 at % selenium; between about 15 at % and about 30 at % tellurium; and between about 25 at % and about 40 at % tin, wherein the sum of the amounts of selenium, tellurium and tin is less than or equal to 100 at %; or
between about 5 at % and about 10 at % germanium; between about 3 at % and about 15 at % tin; and between about 80 at % and about 90 at % tellurium; wherein the sum of the amounts of germanium, tin and tellurium is less than or equal to 100 at %; or
between about 7 at % Bi and about 33 at % Bi; between about 3 at % Sn and about 32 at % Sn; and between about 60 at % Te and about 90 at % Te; or between about 24 at % Bi and about 43 at % Bi; between about 28 at % Sn and about 39 at % Sn; and between about 29 at % Te and about 42 at % Te; or between about 38 at % Bi and about 72 at % Bi; between about 25 at % Sn and about 65 at % Sn; and between about 2 at % Te and about 8 at % Te; wherein the sum of the amounts of bismuth, tin and tellurium is less than or equal to 100 at %; and the phase change material optionally comprises in total at most about 10 at % of one or more dopants selected from carbon, oxygen, nitrogen, bismuth, gold, germanium, tin, tellurium, selenium, sulphur, and (when the phase change material comprises or consists of germanium, tin and tellurium) gold.

Preferably the phase change material has a cyclability corresponding to at least 99.99% contrast remaining (relative to the initial contrast) after 1000 crystallisation/amorphisation cycles.

Particularly preferred phase change materials in accordance with the invention include:

$Sb_{31.91}Ge_{40.07}Te_{28.03}$;
$Sb35.8Ge_{34.91}Te_{29.28}$;

$Sb_{11.72}Ge_{56.57}Te_{31.71}$;
$Sb_{22.26}Ge_{47.06}Te_{30.68}$;
$Sb_{46.96}Ge_{24.95}Te_{28.09}$;
$Sb_{22.8}Ge_{47.82}Te_{29.38}$;
$Sb_{44.34}Ge_{27.5}Te_{28.16}$;
$Sb_{450.54}Ge_{24.96}Te_{29.46}$;
$Sb_{41.45}Ge_{27.93}Te_{30.62}$;
$Sb_{50.51}Ge_{20.3}Te_{29.19}$;
$Sb_{51.96}Ge_{22.01}Te_{26.03}$;
$Sb_{33.78}Ge_{44.23}Te_{21.98}$;
$Sb_{54.49}Ge_{23.97}Te_{21.54}$;
$Sb_{49.8}Ge_{27.68}Te_{22.52}$;
$Sb_{48.8}Ge_{29.98}Te_{21.52}$;
$Sb_{66.3}Ge_{16.2}Te_{17.5}$;
$Sb_{49.67}Ge_{20.43}Te_{29.9}$;
$Sb_{45.57}Ge_{24.96}Te_{29.46}$;
$Sb_{38.68}Ge_{28.41}Te_{32.92}$;
$Sb_{38.37}Ge_{30.62}Te_{31.02}$;
$Sb_{36.15}Ge_{30.89}Te_{32.96}$;
$Sb_{34.27}Ge_{34.99}Te_{30.74}$;
$Sb_{33.79}Ge_{41.06}Te_{25.15}$;
$Sb_{24.63}Ge_{42.71}Te_{32.66}$;
$Se_{51}Te_{21}Sn_{28}$;
$Ge_8Sn_5Te_{87}$; and
$Te_{80}Sn_{15}Ge_5$.

Display Devices

As explained above, the phase change materials described herein are useful in display devices.

Accordingly, the invention provides a display device comprising a phase change material. Preferably, said phase change material has a recrystallization temperature of at most about 250° C. and a recrystallization time of at least about 1 μs. More preferably, said phase change material has a melting point of at most about 500° C. Preferably, said phase change material is a phase change material as described herein. Preferably, said phase change material is a phase change material obtainable by a method as described herein.

The display device of the invention preferably comprises a layer of said phase change material. Preferably, said layer has a thickness of at most about 60 nm. More preferably, said layer has a thickness of at most about 40 nm, such as at most about 20 nm, e.g. from about 1 nm to about 10 nm, such as from about 4 nm to about 8 nm.

Typically, a layer of a phase change material as used in a display device will have a switchable area. The phase change material typically has a property such as a complex refractive index which can be controlled. The property such as the refractive index is typically altered or controlled across an area of the layer of the phase change material. The area across which the property such as the refractive index is altered or controlled is referred to herein as the switchable area of the layer of the phase change material.

Preferably, in the display device of the invention, the layer of said phase change material has a switchable area. Preferably, the switchable area corresponds to the size and geometry of a micro-heater, which (as described below) is typically positioned close to or adjacent to the phase change material (preferably within or behind a reflector layer) to control the phase of the phase change material.

Preferably, the switchable area of said layer is from about 10 μm² to about 100,000 μm², preferably from about 100 μm² to about 50,000 μm², such as from about 500 μm² to about 25,000 μm². For example, a switchable layer area may have a size of e.g. from about 10 μm×10 μm to about 300 μm×300 μm, such as from about 25 μm×25 μm to about 150 μm×150 μm, e.g. from about 50 μm×50 μm to about 100 μm×100 μm. By contrast, typically, the switchable "unit" of phase change material used in memory devices is around 10-50 nm, and in optical storage devices is around 300-700 nm.

Typically, in display devices of the invention, the switchable area corresponds to the size and geometry of the means used to switch the phase change material. For example, the switchable area may correspond to the size of a microheater, which may be positioned adjacent to the phase change material, preferably within or behind the reflector layer from the phase change material, as described in more detail below.

Preferably, in the invention, the display device is a solid-state reflective display device.

The display device of the invention preferably comprises:
a plurality of electrodes:
at least one layer of a phase change material having (i) a recrystallization temperature of at most about 250° C. and a recrystallization time of at least about 1 μs; and/or (ii) a melting point of at most about 500° C.; said phase change material having a refractive index which is reversibly controllable by application of a voltage to said electrodes;
a controller adapted to apply said voltage, via said electrodes, to control the refractive index of said phase change material;
wherein said at least one layer of said phase change material is disposed between a reflector and a viewing surface.

Preferably, in the invention, the electrodes are made of a highly conductive material. Preferred materials include molybdenum, aluminium, silver, gold, and the like.

Preferably, in the invention, the phase change material is a phase change material as described herein.

Preferably, in the invention, the reflector is a layer of metal. More preferably, the reflector is a layer of a metal selected from platinum, aluminium, silver, and alloys such as modified silvers, e.g. APC (an alloy comprising silver, palladium and copper, typically in proportions of about 98% silver, about 0.5% palladium and about 1.5% copper).

Preferably, the display device further comprises at least one spacer layer between said reflector and at least one layer of said phase change material. Preferably, the thickness of the spacer layer is in the range from 10 nm to 250 nm, depending on the colour and optical properties required of the device.

When the display device of the invention comprises a plurality of layers of phase change material, preferably the plurality of layers of phase change material are separated from each other by an equivalent plurality of spacer layers. Thus, the display device of the invention preferably comprises an alternative stack of phase change material layers and spacer layers. The layer that is closest to the reflector is typically a spacer layer. The layer that is furthest from the reflector is typically a phase change material layer.

Preferably, the display device of the invention comprises a capping layer, wherein a surface of said capping layer preferably constitutes the viewing surface. Preferably, the thickness of the capping layer is from about 10 nm to about 100 nm, e.g. about 20 nm.

Preferably, the spacer and the capping layer are both optically transmissive, and are ideally as transparent as possible.

Preferably, the display device further comprises at least one barrier layer between at least one layer of said phase change material and at least one said spacer layer and/or at least one said capping layer. Preferably, the thickness of said barrier layers is from about 1 nm to about 20 nm, e.g. from about 5 nm to about 10 nm. Such barrier layers typically do not affect the optics of the stack (the display device) or at least the display device can be designed to account for any optical effect. Barrier layers can be beneficially included in the display device of the invention to impact the cyclability of the phase change material. For example, said barrier layers can be used to stabilize the phase change material by minimizing degradation over an increased number of switching cycles. Said barrier layers can also be used to modify the switching properties of the phase change material (e.g. its crystallisation speed, crystallisation temperature and melting temperature). In some aspects, a phase change material may have its properties altered by its incorporation in a display device comprising one or more barrier layers according to the invention so that it has the beneficial properties in terms of crystallisation speed, crystallisation temperature and melting temperature described herein for phase change materials of the invention. Suitable materials for said barrier layer(s) include GeN and $ZrO_2$.

Accordingly, the invention provides a display device comprising:
a plurality of electrodes:
at least one layer of a phase change material having (i) a recrystallization temperature of at most about 250° C. and a recrystallization time of at least about 1 µs; and/or (ii) a melting point of at most about 500° C.; said phase change material having a refractive index which is reversibly controllable by application of a voltage to said electrodes;
a controller adapted to apply said voltage, via said electrodes, to control the refractive index of said phase change material;
wherein said at least one layer of said phase change material is disposed between a reflector and a viewing surface;
and wherein said display device optionally further comprises:
at least one spacer layer between said reflector and at least one layer of said phase change material; and/or
a capping layer, wherein a surface of said capping layer preferably constitutes said viewing surface.

The display device of the invention is preferably provided on a substrate. Preferably, the substrate is glass, a semiconductor wafer, quartz ($SiO_2$), or a flexible substrate such as a polymer film (e.g. mylar).

Preferably, in the invention, the layer(s) of phase change material and optionally other layers of the display device are deposited using sputtering, which can be performed at a relatively low temperature of 100 Celsius. Any suitable sputtering technique can be used, including DC sputtering, Pulsed DC sputtering, RF sputtering and biased RF sputtering. DC sputtering is preferred. The layers can also be patterned as required, using conventional techniques known from lithography, or other techniques e.g. from printing. Additional layers may also be provided for the device as necessary. Accordingly, the invention also provides a method of fabricating a display device, comprising sputtering at least one layer of a phase change material onto a surface, wherein said sputtering is preferably DC sputtering; wherein said phase change material has (i) a recrystallization temperature of at most about 250° C. and a recrystallization time of at least about 1 µs; and/or (ii) a melting point of at most about 500° C. Preferably, in such methods, the phase change material is a phase change material as described herein.

Preferably, in the invention, the controller is provided to apply the required voltages for the necessary durations to switch the phase change material layer of the device between amorphous and crystalline phases each having different specific refractive indices, and vice versa. Preferably, the controller comprises specific electronic circuitry driven by a microprocessor. Some or all of the circuitry of the controller can be provided integrated onto a substrate with the display device of the invention, or can be provided as separate dedicated circuitry.

Typically, in the invention, as explained below, the controller drives a micro-heater which is configured to control the phase of the phase change material in the display device via thermal conduction. The power of the microheater is determined by its internal resistance and current/voltage rating. The power of the microheater is chosen to deliver the required thermal impulse to the phase change material. For example, a 200 mW microheater often has a 500 ohm internal resistance and is driven by a 10V-20 mA impulse pulse. Preferably, the power of the microheater is less than 200 mW, such as less than 150 mW, e.g. less than 100 mW. Lower powers are needed as the melting temperature of the phase change material is decreased.

The micro-heater is typically located underneath the reflector (i.e. positioned on the opposite site of the reflector to the at least one layer of the phase change material). Typically, the micro-heater and the reflector are electrically isolated. In such arrangements, switching of the phase change material typically happens predominantly or solely via thermal conduction.

Typically, the reflector and/or phase change material layers are patterned so that a single region has a corresponding single microheater, and the shape and intensity of the thermal response from this microheater is designed to heat the PCM region to either the crystallisation or melting temperature for the required time to effect a switch. The phase change materials of the invention are specifically suitable for this type of larger area, micro-heater based switching as opposed to direct electrical switching as used in e.g. PCRAM, or laser optical switching as used in optical disc (DVD, Bluray etc) devices. In brief, the display device of the invention operates as follows. Light enters and leaves through the viewing surface. However, because of interference effects dependent on the complex refractive indices and thicknesses of the phase change material, spacer and capping layers, the reflectivity varies significantly as a function of wavelengths of light. By controlling the refractive index of the phase change material layer, the reflectivity of the light can be controlled and thereby the optical properties of the display device can be controlled.

Accordingly, the invention also provides the use of a phase change material as an optical absorber in a display device, wherein said phase change material has (i) a recrystallization temperature of at most about 250° C. and a recrystallization time of at least about 1 µs; and/or (ii) a melting point of at most about 500° C. Preferably, the phase change material is a phase change material as described herein.

Those skilled in the art will appreciate that in the display device of the invention, the phase change material does not have to be switched simply between a fully crystalline and a fully amorphous state. A mixture of phases can be achieved, such as 20% crystalline, 40% crystalline etc. Partial crystallisation is achieved by simply limiting the maximum current allowed during a switching event (e.g. using a variable resistor in series with one of the electrodes connected to the device). The resulting effective refractive index of the phase change material layer is somewhere between the two extremes of fully crystalline and fully amorphous depending on the degree of partial crystallisation. Typically between 4 and 8 distinct mixed phases are achievable, but with appropriate control, the number of achievable phases can be much higher, such as 128 values, and effectively a continuum of refractive index values can be achieved, corresponding to tracing a path through colour space. Those skilled in the art will appreciate that, although when in use in a display device in accordance with the present disclosure, a phase change material need not be switched simply between a fully crystalline and a fully amorphous state, the inherent (re)crystallisation properties of the material are still relevant. Thus, for example, advantageous materials in accordance with the present invention may have desired (re)crystallisation times and/or temperatures or melting points, but may not necessarily be applied so as to fully switch between a fully crystalline and a fully amorphous state when in use in a display device in accordance with the present disclosure.

The invention also provides a display comprising a plurality of independently controllable display devices as described herein. Such independently controllable display devices are also referred to herein as "structures". In one aspect, a plurality of such display devices (structures) are fabricated adjacent to each other in an array, with each structure within the cluster constituting a sub-pixel, and being independently controllable. In another aspect, each pixel of the overall display can comprise a cluster of several display devices (structures) as described herein, with each pixel being independently controllable. Thus, in one embodiment, a pixel comprises a cluster of multiple structures, all of which may be switched together. In another embodiment, a pixel comprises a cluster of multiple structures which may be switched independently. In this aspect, each display device structure within the cluster typically has a different thickness of the spacer layer, which allows each structure within the cluster to switch between different colours, and the pixel comprising the cluster can be made to appear a wide range of different colours within the colour space. Typically, the number of individual structures of different thicknesses within the cluster comprising a pixel is three or even more.

It will be apparent to those skilled in the art that in display devices of the invention, an array of independently switchable pixel regions may be used. Each pixel may comprise a phase change material stack as described herein. As such, each pixel may have a reflectivity which is switchable between two different stable states. The consequence of this is that the array is therefore controllable to allow any reconfigurable 2-d pattern of the different available reflectivities to be exhibited by the array.

The display may be a direct-view display, in which the pattern of reflectivities comprises an image or other information directly visible on the display to a viewer. Alternatively, the display may comprise a reflective spatial light modulator for use in e.g. a projection display, in which an input beam or beam of light is modulated by the display, and then projected onto a separate screen or into free space for viewing. In this configuration, the display may modulate at each pixel either or both of the phase or amplitude of the input light to provide either a conventional or holographic projection display. Additionally, the spatial light modulator may be used for non-display applications for which reflective SLMs have been proposed, such as wavefront correction in imaging applications, beam steering, routing or multiplexing in telecoms type applications, or as a surface with dynamically adjustable conductivity for e.g. reconfigurable antennas for RF, terahertz or other nonvisible wavelength control or detection.

Synthesis

Phase change materials described herein can be made using any suitable technique. Exemplary synthetic routes are described in the Examples.

In brief, phase change materials in accordance with the invention can be produced by deposition of pre-composed target materials (which are typically commercially available, and are usually made via hot-press/sintering of the component elements), or by co-sputtering or co-evaporating multiple, pure element sputtering targets at the same time. The precise composition of the phase change material can be controlled by tuning the deposition rate of each elemental target.

Accordingly, the invention provides a method of producing a phase change material as defined herein, comprising sintering, co-sputtering or co-evaporating the elemental components of the phase change material.

The invention also provides a phase change material obtainable by a method described herein.

Those skilled in the art will appreciate that there are many possible routes to production of phase change materials in accordance with the invention, and multiple applications of such phase change materials in display devices. As such, a negative result in any one application is not determinative.

EXAMPLES

Examples 1 to 29

Synthesis of Phase Change Materials

Various phase change materials in accordance with the invention were produced. Phase change materials are usually vacuum deposited in the form of thin film. Most common techniques are sputtering or evaporation from a pre-composed solid target made of a desired composition. These techniques were used as set out in Table 1 below to produce the exemplary phase change materials.

Multi-element phase change materials can be synthesized via co-sputtering and/or co-evaporation techniques. In these techniques a specific composition is obtained using multiple sources of pure elements deposited at the same time. The resulting composition of the phase change material as deposited can be achieved by controlling the deposition rate of each sources.

Co-sputtering and co-evaporation techniques are known and are routine to those of skill in the art. By way of brief summary phase change materials in accordance with the invention can be produced as follows.

A. A target elemental composition is defined, for example $A_xB_yC_z$, wherein A, B and C are elements for incorporation into the phase change material and x, y and z are the relative amounts of each material. For example, in the phase change material $Te_{87}Ge_8Sn_5$, A=Te, B=Ge, C=Sn, x=87, y=8 and z=5.

B. A target thickness for the PCM layer is chosen. Any suitable thickness can be used, e.g. from about 5 to about 50 nm, such as for example 20 nm. The layer needs to maintain an atomic ratio of $A_xB_yC_z$ over the entire substrate on which the phase change material is deposited. Suitable substrates include wafers having diameters of from 1 to 6 inches, such as for example a 4 inch wafer.

C. The deposition rate of each element (A, B and C) is separately calibrated so that the resulting phase change material layer when deposited at the desired thickness reaches the target elemental composition.

TABLE 1

| Ex. | PCM TYPE | Sb /at % | Ge | Te | Sn | Se | TOT | Synthesis method | Barrier | Initial $t_x$ /μs | Contrast (1k cycles) % | MP /° C. | $T_x$ /° C. |
|---|---|---|---|---|---|---|---|---|---|---|---|---|---|
| 1 | GST | 31.9 | 40.1 | 28.0 | 0.0 | 0.0 | 100.0 | Co-evaporation | No | 1000 | 100 | >600 | 150-250 |
| 2 | GST | 35.8 | 34.9 | 29.3 | 0.0 | 0.0 | 100.0 | Co-evaporation | No | 1000 | 100 | >600 | 150-250 |
| 3 | GST | 11.7 | 56.6 | 31.7 | 0.0 | 0.0 | 100.0 | Co-evaporation | No | 1000 | 100 | >600 | 150-250 |
| 4 | GST | 22.3 | 47.1 | 30.7 | 0.0 | 0.0 | 100.0 | Co-evaporation | No | 1000 | 96 | >600 | 150-250 |
| 5 | GST | 47.0 | 25.0 | 28.1 | 0.0 | 0.0 | 100.0 | Co-evaporation | No | 280 | 96 | >600 | 150-250 |
| 6 | GST | 22.8 | 47.8 | 29.4 | 0.0 | 0.0 | 100.0 | Co-evaporation | No | 9 | 93 | >600 | 150-250 |
| 7 | GST | 44.3 | 27.5 | 28.2 | 0.0 | 0.0 | 100.0 | Co-evaporation | ZrO2 | 193 | 100 | >600 | 150-250 |
| 8 | GST | 45.6 | 25.0 | 29.5 | 0.0 | 0.0 | 100.0 | Co-evaporation | ZrO2 | 17 | 100 | >600 | 150-250 |
| 9 | GST | 41.5 | 27.9 | 30.6 | 0.0 | 0.0 | 100.0 | Co-evaporation | ZrO2 | 75 | 100 | >600 | 150-250 |
| 10 | GST | 50.5 | 20.3 | 29.2 | 0.0 | 0.0 | 100.0 | Co-evaporation | ZrO2 | 30 | 100 | >600 | 150-250 |
| 11 | GST | 52.0 | 22.0 | 26.0 | 0.0 | 0.0 | 100.0 | Co-evaporation | ZrO2 | 17 | 100 | >600 | 150-250 |
| 12 | GST | 33.8 | 44.2 | 22.0 | 0.0 | 0.0 | 100.0 | Co-evaporation | ZrO2 | 20 | 100 | >600 | 150-250 |
| 13 | GST | 54.5 | 24.0 | 21.5 | 0.0 | 0.0 | 100.0 | Co-evaporation | ZrO2 | 20 | 100 | >600 | 150-250 |
| 14 | GST | 49.8 | 27.7 | 22.5 | 0.0 | 0.0 | 100.0 | Co-evaporation | ZrO2 | 36 | 100 | >600 | 150-250 |
| 15 | GST | 48.8 | 30.0 | 21.2 | 0.0 | 0.0 | 100.0 | Co-evaporation | ZrO2 | 75 | 100 | >600 | 150-250 |
| 16 | GST | 26.3 | 11.6 | 62.1 | 0.0 | 0.0 | 100.0 | Co-evaporation | GeN | 11.5 | 100 | >600 | 150-250 |
| 17 | GST | 34.5 | 11.7 | 53.8 | 0.0 | 0.0 | 100.0 | Co-evaporation | GeN | 13.9 | 100 | >600 | 150-250 |
| 18 | GST | 66.3 | 16.2 | 17.5 | 0.0 | 0.0 | 100.0 | Co-evaporation | GeN | 11.5 | 100 | >600 | 150-250 |
| 19 | GST | 49.7 | 20.4 | 29.9 | 0.0 | 0.0 | 100.0 | Co-evaporation | GeN | 91 | 100 | >600 | 150-250 |
| 20 | GST | 45.6 | 25.0 | 29.5 | 0.0 | 0.0 | 100.0 | Co-evaporation | GeN | 596.4 | 100 | >600 | 150-250 |
| 21 | GST | 38.7 | 28.4 | 32.9 | 0.0 | 0.0 | 100.0 | Co-evaporation | GeN | 91 | 100 | >600 | 150-250 |
| 22 | GST | 38.4 | 30.6 | 31.0 | 0.0 | 0.0 | 100.0 | Co-evaporation | GeN | 233 | 100 | >600 | 150-250 |
| 23 | GST | 36.2 | 30.9 | 33.0 | 0.0 | 0.0 | 100.0 | Co-evaporation | GeN | 110 | 100 | >600 | 150-250 |
| 24 | GST | 34.3 | 35.0 | 30.7 | 0.0 | 0.0 | 100.0 | Co-evaporation | GeN | 720 | 100 | >600 | 150-250 |
| 25 | GST | 33.8 | 41.1 | 25.2 | 0.0 | 0.0 | 100.0 | Co-evaporation | GeN | 52 | 100 | >600 | 150-250 |
| 26 | GST | 24.6 | 42.7 | 32.7 | 0.0 | 0.0 | 100.0 | Co-evaporation | GeN | 1527 | 100 | >600 | 150-250 |
| 27 | STS | 0.0 | 0.0 | 21.0 | 28.0 | 51.0 | 100.0 | Solid target | No | 2000 | 100 | 450 | 165 |
| 28 | STS | 0.0 | 0.0 | 67.0 | 13.0 | 20.0 | 100.0 | Solid target | No | 1000 | 25 | 450 | 110 |
| 29 | TGS | 0.0 | 8.0 | 87.0 | 5.0 | 0.0 | 100.0 | Solid target | No | 2000 | 100 | 380 | 135 |

TOT = total
$t_x$ = crystallisation time
Contrast = percentage of initial contast remaining after 1000 cycles
MP = melting point
Tx = crystallisation temperature Example 30

Devices based on ultra-thin-films of solid-state phase-change materials (PCMs) were produced and tested. The devices display beneficial properties arising from the properties of the phase change materials used in their production.

Figure 6:
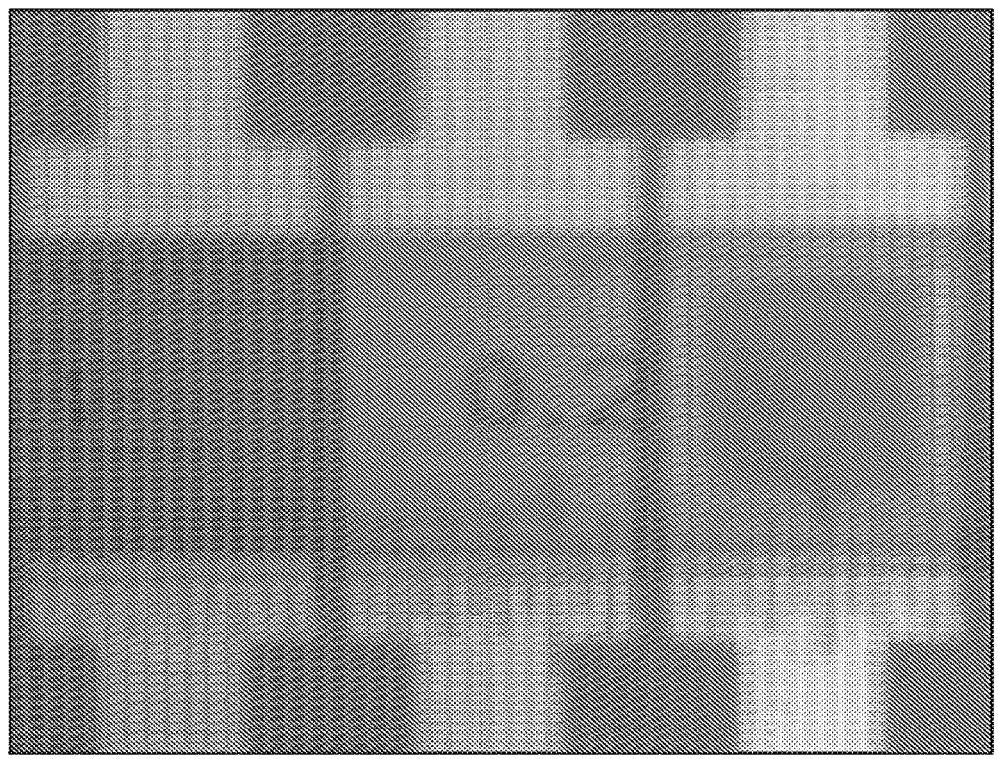
FIG. 6 shows a micro-photograph of a line of 56×56 µm SRD pixel comprising a phase change material in accordance with the invention, in the as-deposited amorphous state (left), crystallised state (centre) and re-amorphised state (right).

In the following Example, any of the phase change materials of Examples 1 to 29 (listed in Table 1) could be successfully used to produce display devices which demonstrate the advantageous switching appearance illustrated in FIG. 6 below. The specific results described below and shown in FIG. 6 were obtained from devices using a TGS phase change material ($Te_{87}Ge_8Sn_5$) and an STS phase change material ($Te_{21}Sn_{28}Se_{51}$).

The devices fabricated had an active area of 50×50 microns, and a crystallisation time of >1 microsecond was found to enable two-way switching functionality in devices of this size.

Production of Solid-State Reflective Displays (SRD) Utilizing Ultrathin Phase Change Materials.

Devices based on ultra-thin-films of solid-state phase-change materials (PCMs) provide an entirely new means of achieving bistable, bright, vividly coloured, switchable reflective surfaces. In this Example, we outline the electro-optic mechanism underpinning such devices, discuss their unique potential to enable a new class of video capable colour reflective displays, and present for the first time repeatable electrical switching of display-pixel sized PCM devices between two highly contrasting optical states.

1. Introduction

Ultra-thin film phase change material based devices were recently shown to provide an entirely new means of generating, bright, vividly coloured reflections from a surface, switchable between two strikingly different, bistable states [1]. Uncoloured, highly absorbing dielectric films of 5-50 nm thickness may create coloured reflections when coated onto a metallic substrate due to the strong interference effect [2], with very little viewing angle dependence compared to traditional Fabry-Perot interference based devices. Phase change materials (PCMs) such as Germanium-Antimony-Tellurium (GST) alloys are switchable between amorphous and crystalline states via optical, electrical or thermal means. These states are long-term stable, may be switched between in nanosecond timescales, and exhibit markedly different electrical and optical properties. These attributes have resulted in their use in electrical memory [3] and laser optical disk [4] applications. However, their high optical absorption, and limited scope for modulation of broadband visible light has precluded the use of these materials in display devices.

In this Example we demonstrate that the light modulating effect of a PCM layer thin enough to prevent excessive absorption (<50 nm) may be effectively amplified to enhance the range and degree of saturation of the available reflected colours. This is achieved via use of the active ultra-thin PCM layer as the lossy absorber in a strong interference stack having an additional thin (sub-wavelength) transparent spacer layer between the metallic mirror substrate and the absorber layer [1].

The realisation of a reflective display which is capable of producing both vivid, saturated colours, and a high brightness white remains one of the key unsolved challenges within display technology [5], and the absence of a product-ready solution with this capability is the cause of recent and predicted future stagnation of the reflective display market [6]. To avoid the colour-luminance compromise, a reflective display technology must be capable of producing multiple colours within the same pixel area. Various methods have been developed to achieve this, including stacked multiple modulator designs with both additive and subtractive colour [5], and single modulator, multi-stable, interferometric [7] or electrophoretic [8] devices, but none so far have proven both technically feasible and economically manufacturable.

The ultra-thin-film PCM based strong-interference electro-optic effect is a new approach which has the potential to provide this key capability. In addition to switchable colour within a single pixel area, the solid-state reflective display (SRD) is expected to provide very fast (sub ms) response for full video capability, and full bistability for zero power image retention.

In order to utilise this new electro-optic effect as the basis for an improved reflective display there are two key challenges:

a.) Electrical switching of display pixel sized areas. The originally demonstrated electrical switching of these devices via e-beam lithographic electrode patterning, or by the use of a conductive atomic force microscope tip [1] demonstrated the fascinating potential for new nanoscale image applications; however, neither are feasible methods on which to base a mass-manufacturable electronically updatable display for either direct view, or as the microdisplay element in a projected image system. For these applications, electrical switching of regions in the 5 micron to 150 micron scale is required. Very high speed (~100 ns) electrical switching of larger area (10 micron scale) regions of PCM material has been demonstrated for reconfigurable RF antenna applications [9,10], but these devices are designed for large electrical conductivity switching, and show minimal optical contrast. The first challenge is therefore to demonstrate larger pixel areas.

b.) Improved colour control. The previously demonstrated reflected colour states [1] showed a high degree of colour difference, and high overall reflectivity. However, the two states were not optimised for colour image display purposes. In order to provide a large colour gamut reflective display, designs providing a bright and saturated, red, green or blue colour in one state, each of which is switchable to either (or preferably both of) a dark state for high contrast, or a pale high-reflectivity state for high brightness white, are required.

2. The SRD Concept

In order to address these challenges, a complete redevelopment of the pixel design, including materials (the active PCM alloy used, the transparent spacer/capping materials and the metallic mirror), electrode geometry and addressing pulses has been undertaken. PixelDesign: Crossbar type switching designs for PCM devices of the type previously outlined [1] suffer from limited scalability due to a filamentary switching issue. As the PCM material exhibits markedly different electrical conductivity in the two states, switching mechanisms which rely on current pulses applied through the PCM material itself tend to switch partially until a low resistance current path is formed, which then funnels the remaining current itself, preventing switching elsewhere in the device. Additionally, although the family of GST phase change alloys has been very well studied for phase change memory devices, and has shown very good electrical switching and sensing reliability over millions of cycles [11], the materials and device geometries have been designed to allow nanometre scale area addressing (for maximum data density) and for nanosecond read-write times (for maximum data transfer speed). In order to allow reamorphisation of a crystalline state pixel on the tens of microns scale, the crystallisation time of the material has to be extended to allow the larger volume of active material to settle into the glassy amorphous state before crystallisation spontaneously occurs.

Figure 5:
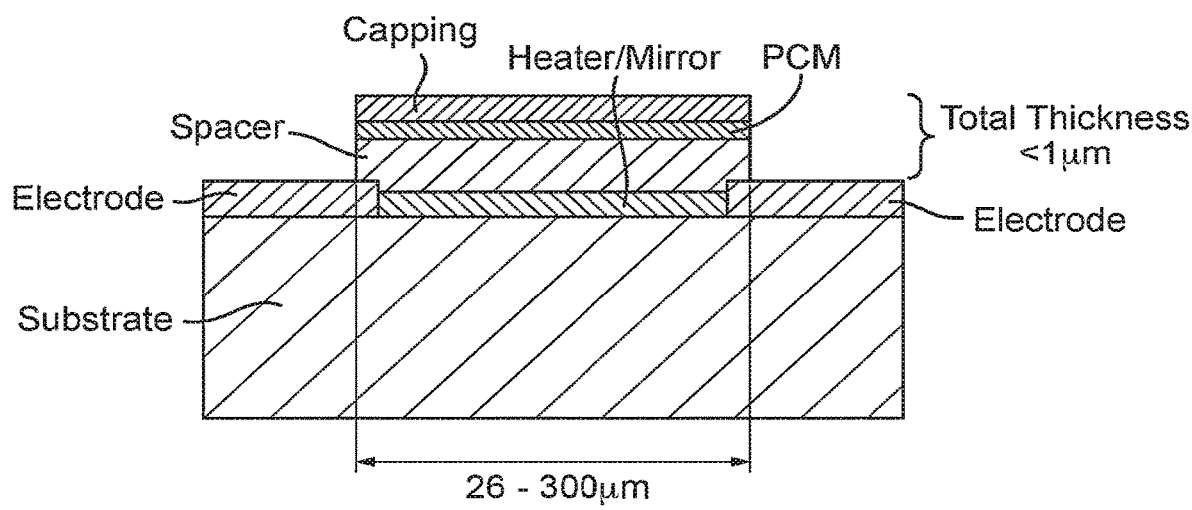
FIG. 5 shows an SRD pixel design comprising a phase change material in accordance with the present invention.

A microheater pixel design, illustrated in FIG. 5, was adopted to convert applied voltage pulses to a uniform, controlled thermal response in the active region, over the required areas. This thermally-modulated addressing mechanism avoids the filamentary switching issue by removing the requirement for the active material to conduct the electrical current induced by the switching pulses. This simplifies the switching mechanism, as current pulses are now applied to a simple resistive heating element, rather than an active layer with highly changeable resistance, and allows the required larger area activation. A further benefit is the complete separation of the design and function of the electrical addressing backplane, and the optical frontplane. The passive transparent layers within the stack may now be electrically insulating allowing improved freedom of optical design and the selection of materials may be based on optical and thermal properties, rather than electrical.

A range of phase change materials in accordance with the invention were tested and found to be suitable in the applications described in this Example. Specific results were obtained from devices using a TGS phase change material ($Te_{87}Ge_8Sn_5$) and an STS phase change material ($Te_{21}Sn_{28}Se_{51}$).

3. Experimental Results

Electrical Switching: Using the microheater SRD pixel design, this Example demonstrates for the first time repeatable, two-way electrical switching of PCM based devices having high optical contrast between the two states, over active areas in the range of 25×25 μm to 300×300 μm. A microphotograph of three neighbouring SRD pixels of 56 μm×56 μm size, in the as-deposited (amorphous) state, the crystallised state, and the re-amorphised state respectively is given in FIG. 6.

Several sets of 24 such pixels were fabricated and each pixel of which was repeatedly cycled between the two states in a co-ordinated but independent manner by a customised, portable, USB powered electronic drive board based around an FPGA.

These proof-of-concept devices were designed to be straightforwardly fabricable, using room-temperature RE sputtering of industry standard materials (transparent, insulating oxides for the spacer and capping layer, and PCM materials from the GST alloy family. Both amorphous-to-crystalline and crystalline-to-amorphous switching was achieved with voltage pulses of less than 10V amplitude and sub-millisecond duration.

As has been shown in PCM based memory and RF devices, crystallising the material requires a lower amplitude, longer duration pulse, to raise the temperature of the material above its glass-transition point for long enough to allow crystallisation to occur, while reamorphisation requires a shorter, higher amplitude pulse to raise the PCM material above its melting point and subsequently quench it via rapid cooling before crystallisation may occur.

This demonstration of the first electrically switched PCM based display pixels provides proof-of-concept of the solid-state reflective display. The results highlight potential for the SRD to enable jewellery and high design-freedom wearable devices or IoT objects to incorporate a low-power display which is near-invisible in its off state due to matching the metallic surround.

4. Full-Colour Display Potential

In addition to the novel 2-colour display outlined above, the SRD also has potential to provide a full-colour reflective display with a combination of high brightness white state and colour gamut area beyond what is currently achievable with existing reflective display technologies.

Simulated Optical Performance

The reflection spectra of SRD optical stacks with any variety of materials and layer thicknesses may be calculated from the wavelength dependent complex refractive index values of the proposed materials, using a straightforward transfer matrix optics (TMO) approach. A customised TMO based search algorithm was developed to find optimised, complementary, stack designs for three or more sub-pixel types which would in one combination of amorphous or crystalline states in the different sub-pixels provide a large colour gamut, and in another combination provide a high brightness white state. These simulations yielded a range of designs indicating that with a simple set of sub-pixel stack designs (each being a total of 4 layers of the same 3 materials: mirror, spacer/capping, PCM) a colour gamut of 60% of the sRGB standard (by area, CIE 1931 colour space) is achievable with a pale-state reflected luminance of 50%, or if a higher reflected luminance of 60% is desirable, a colour gamut of 40% sRGB may still be achieved.

Figure 7:
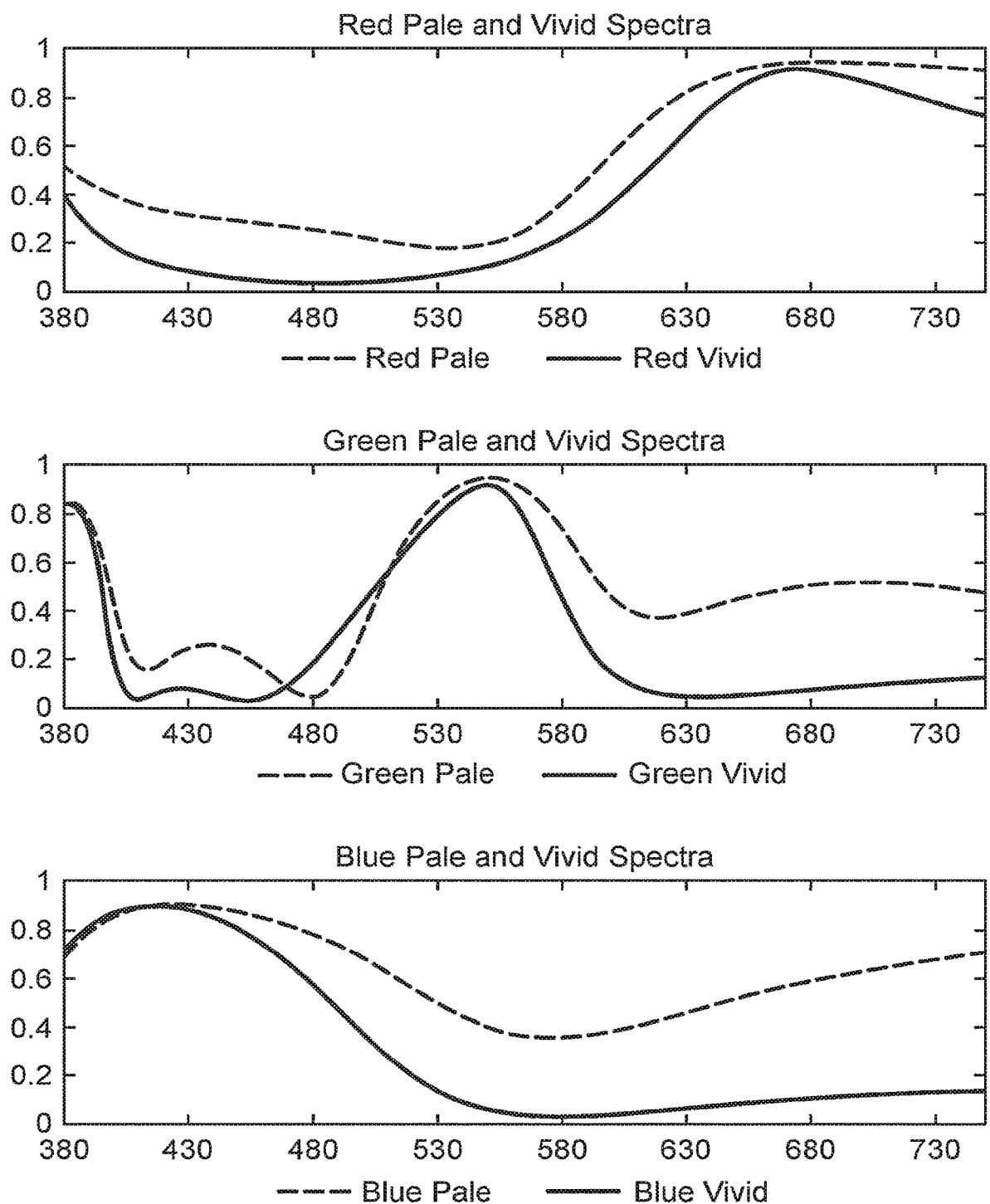
FIG. 7 shows simulated reflection spectra for R, G and B sub-pixel designs comprising phase change materials in accordance with the present invention, showing switching from the vivid to pale state.
Figure 8:
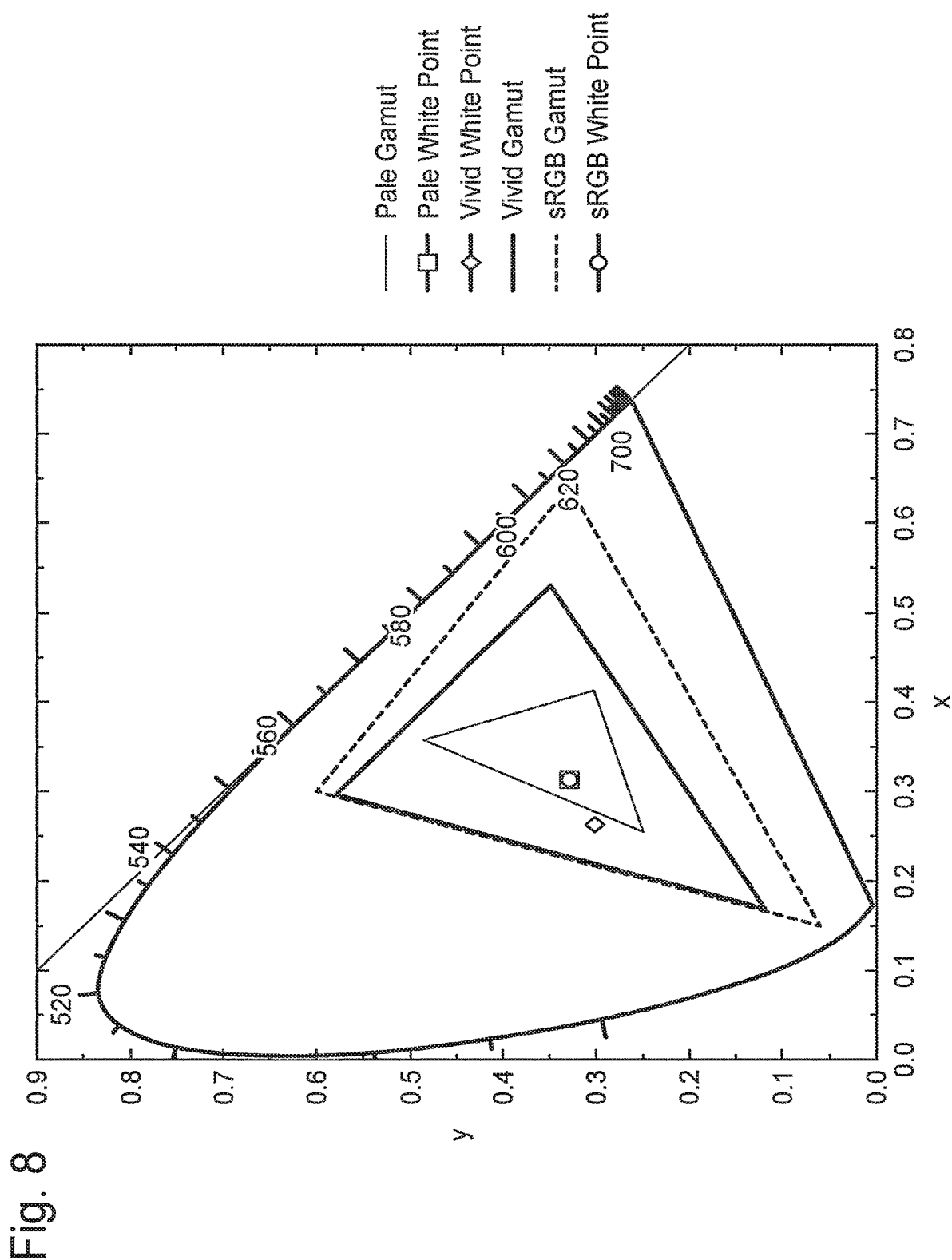
FIG. 8 shows a CIE 1931 colour diagram illustrating the colour gamut and white point resulting from the combination of sub-pixel spectra in FIG. 7 in the pale state (grey line) and vivid state (black line) relative to the sRGB standard (dotted line).

The predicted reflection spectra which lead to these expected colour gamut and white reflectivity values are shown in FIG. 7, and the gamut and white point under D65 illumination are plotted in FIG. 8.

Figure 9:
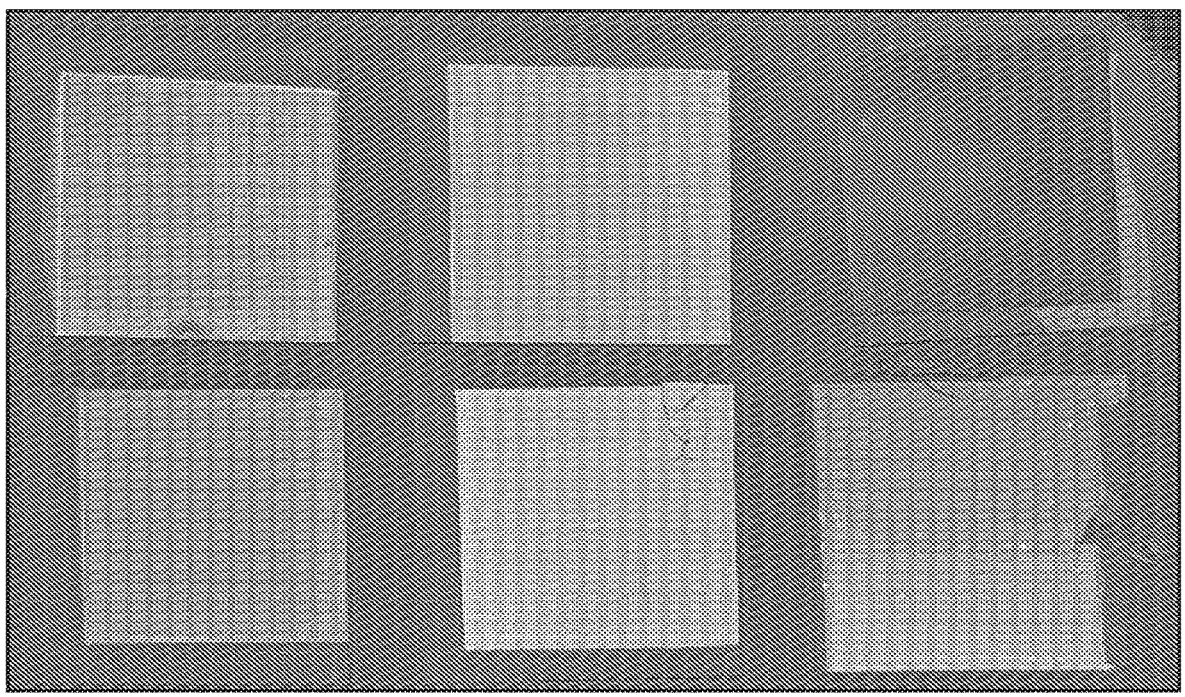
FIG. 9 shows a photograph of samples deposited according to the stack design simulated in FIG. 7, showing the transition from vivid (upper row) to pale (lower row), for R, G and B designs.

In order to verify the simulated reflection spectra, optical stacks were deposited separately according to the design for each sub-pixel. These samples were then cleaved and half of each heated, to crystallise the PCM material from its as-deposited amorphous state, providing visual confirmation of the switch from the expected saturated colour state to the pale, high brightness state or vice-versa. FIG. 9 shows a photograph of these experimentally realised thin film stacks showing both the pale and vivid R, G and B states.

These simulation results, and initial experimental samples, indicate that a full colour display with white-state reflectivity meeting or exceeding that of current monochrome reflective displays, while providing over 50% sRGB gamut capability is possible, using the ultra-thin film PCM based switchable reflector with sub-pixels configured to switch between a vivid R, G or B, and a pale, high reflectivity state. Further simulations which allow for increased complexity in the optical stack design, using multiple layers of up to three spacer materials having different refractive indices, suggest further improvement is possible, up to a reflected luminance of 52% with a gamut area of 80% sRGB.

In order to achieve a black state, necessary for high contrast, and greyscale control, a further degree of control is required. In the ideal case, a single pixel region would be switchable between a white, coloured and black state, but the single active layer pixel is a two-state device. There is potential to develop the SRD pixel to incorporate two, independently switchable PCM layers, and therefore be switchable into four different states. It may be more expedient though to achieve a black state by using an additional switchable shutter over the SRD pixel, such as a polariser free liquid crystal mode, or an e-wetting pixel. The all solid-state, sub-micron thickness and bistable qualities of the SRD pixel mean it could feasibly be incorporated as a switchable colour filter on the active-matrix substrate of a more conventional display device.

5. Summary

These results demonstrate the feasibility of a low-power, high colour reflective display based on a modulation mechanism—reversible phase-change material crystallisation in an ultra-thin film stack—which is entirely new to the field of displays. Simulated performance indicates that a display utilising this effect can be designed to provide white-state luminance reflectivity of over 50% and a colour gamut of 40%-80% of sRGB depending on fabrication complexity. This compares very favourably with current monochrome e-reader displays which offer similar luminance reflectivity but no colour capability, and reflective LCD displays which have much reduced (~21%) reflectivity and typically ~35% sRGB gamut capability [12].

In addition to the promising optical performance, reversible electrical switching of a display-pixel sized area of an active PCM layer, with high optical contrast, has been shown for the first time in the microheater based SRD pixel. It is envisaged that further development and characterisation of these new pixels will allow incorporation into large arrays with conventional addressing schemes and very high fill-factor, providing the first high-colour, high reflectivity, video capable, bistable reflective displays.

The materials, structure and deposition methods used in these devices are compatible with large area/volume sputtering processes, and may be applied to flexible substrates. With a total thickness of the optical layers of approximately 500 nm, there is also potential for extremely flexible devices.

The solid-state reflective display (SRD) is intended to be suitable for a range of potential applications where zero power image maintenance with vivid colour for freedom of design, and video capability are desirable. Applications are envisaged ranging from simple 2-colour displays for wearable devices, internet-of-things objects, and secondary notification displays for mobile phones, to full-colour reflective displays for colour e-readers, automotive and outdoor signage applications.

This Example thus demonstrates that phase change materials in accordance with the invention can be beneficially applied in a display device according to the invention.

REFERENCES

[1] Hosseini, P., Wright, C. D. & Bhaskaran, H. "An optoelectronic framework enabled by low-dimensional phase-change films" Nature 511, 206-211 (2014).
[2] Kats, M. A., Blanchard, R., Genevet, P.& Capasso, F. "Nanometre optical coatings based on strong interference effects in highly absorbing media" Nature Mater. 12, 20-24 (2013).
[3] Wuttig, M. "Phase-change materials-towards a universal memory?" Nature Mater. 4, 265-266 (2005).

[4] Ohno, E., Yamada, N., Kurumizawa, T., Kimura, K. & Takao, M. "TeGeSnAu alloys for phase-change type optical disk memories" Jpn. J. Appl. Phys. 28, 1235-1240 (1989).

[5] Heikenfeld, J., Drzaic, P., Yeo, J-S., & Koch, T. "A critical review of the present and future prospects for electronic paper" Journal of the SID, 19, 2 129-156 (2011)

[6] http://www.luxresearchinc.com/news-and-events/press-releases/read/narket-top-energing-display-technologies-nearly-triple-21

[7] Hong, J et. al., "Single Mirror Interferometric Display—A New Paradigm for Reflective Display Technologies" SID Digest, 45, 793-796 (2014)

[8] Telfer, S., McCreary, M. D., "A Full-Color Electrophoretic Display" SID Digest, 47, 574-557 (2016)

[9] El-Hinnawy, N., et. al. "Improvements in GeTe-based inline phase-change switch technology for RF switching applications" CS MANTECH, pp. 401-403 (2014)

[10] Wang, M., Lin, F. & Rais-Zadeh, M., "Performance measurements and non-linearity modeling of GeTe phase change RF switches with direct and indirect heating schemes" Microwave Symposium (IMS), 2015 IEEE MTT-S International, pp. 1-4 (2015)

[11] Lankhorst, M. H. R., Ketelaars, B. W. S. M. M. & Wolters, R. A. M. "Low-cost and nanoscale non-volatile memory concept for future silicon chips". Nature Mater. 4, 347-352 (2005).

[12] http://www.j-display.com/product/pdf/LPMO13M091A_v1.pdf

The invention claimed is:

1. A phase change material for use in a display device, wherein said phase change material is selected from:

$Sb_{31.91}G_{40.07}Te_{28.03}$;
$Sb_{35.8}Ge_{34.91}Te_{29.28}$;
$Sb_{11.72}G_{56.57}Te_{31.71}$;
$Sb_{22.26}Ge_{47.06}Te_{30.68}$;
$Sb_{46.96}Ge_{24.95}Te_{28.09}$;
$Sb_{22.8}Ge_{47.82}Te_{29.38}$;
$Sb_{44.34}Ge_{27.5}Te_{28.16}$;
$Sb_{45.54}Ge_{24.96}Te_{29.46}$;
$Sb_{41.45}Ge_{27.93}Te_{30.62}$;
$Sb_{50.51}Ge_{20.3}Te_{29.19}$;
$Sb_{51.96}Ge_{22.01}Te_{26.03}$;
$Sb_{33.78}Ge_{44.23}Te_{21.98}$;
$Sb_{54.49}Ge_{23.97}Te_{21.54}$;
$Sb_{49.8}Ge_{27.68}Te_{22.52}$;
$Sb_{48.8}Ge_{29.98}Te_{21.52}$;
$Sb_{66.3}Ge_{16.2}Te_{17.5}$;
$Sb_{49.67}Ge_{20.43}Te_{29.9}$;
$Sb_{45.57}Ge_{24.96}Te_{29.46}$;
$Sb_{38.68}Ge_{28.41}Te_{32.92}$;
$Sb_{38.37}Ge_{30.62}Te_{31.02}$;
$Sb_{36.15}Ge_{30.89}Te_{32.96}$;
$Sb_{34.27}Ge_{34.99}Te_{30.74}$;
$Sb_{33.79}Ge_{41.06}Te_{25.15}$;
$Sb_{24.63}Ge_{42.71}Te_{32.66}$;
$Se_{51}Te_{21}Sn_{28}$;
$Ge_8Sn_5Te_{87}$; and
$Te_{80}Sn_{15}Ge_5$, and wherein said phase change material has a recrystallization temperature of at most about 250° C. and a recrystallization time of at least about 1 μs.

2. The phase change material of claim 1, wherein said phase change material has a recrystallization temperature of at most about 200° C. and/or a recrystallization time of at least about 2 μs.

3. The phase change material of claim 1, wherein said phase change material has a recrystallization temperature of at least about 70° C. and/or a recrystallization time of at most about 100 μs.

4. The phase change material of claim 1, wherein said phase change material has a melting point of at most about 500° C.

5. The phase change material of claim 1, wherein said phase change material has a cyclability corresponding to at least 99% contrast remaining relative to the initial contrast after 1000 crystallisation/amorphisation cycles.

6. The phase change material of claim 1, wherein said phase change material comprises in total at most about 10 at % (atomic percentage)-of one or more dopants.

7. The phase change material of claim 1, wherein said dopants comprise one or more of carbon, oxygen, nitrogen, bismuth, gold, germanium, tin, tellurium, selenium, sulphur, and when the phase change material comprises or consists of germanium, tin and tellurium gold.

* * * * *